US012677574B2

(12) United States Patent
Lee

(10) Patent No.: US 12,677,574 B2
(45) Date of Patent: Jul. 7, 2026

(54) DISPLAY DEVICE AND METHOD FOR MANUFACTURING THE SAME

(71) Applicant: Samsung Display Co., LTD., Yongin-si (KR)

(72) Inventor: Seung Hoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 383 days.

(21) Appl. No.: 18/327,809

(22) Filed: Jun. 1, 2023

(65) Prior Publication Data

US 2024/0099109 A1 Mar. 21, 2024

(30) Foreign Application Priority Data

Sep. 16, 2022 (KR) ........................ 10-2022-0117011

(51) Int. Cl.
| | |
|---|---|
| *H10K 59/80* | (2023.01) |
| *H10K 59/12* | (2023.01) |
| *H10K 59/40* | (2023.01) |
| *H10K 71/80* | (2023.01) |
| *H10K 77/10* | (2023.01) |
| *H10K 102/00* | (2023.01) |

(52) U.S. Cl.
CPC ....... *H10K 59/878* (2023.02); *H10K 59/1201* (2023.02); *H10K 59/40* (2023.02); *H10K*

*59/879* (2023.02); *H10K 71/80* (2023.02); *H10K 77/111* (2023.02); *H10K 2102/311* (2023.02)

(58) Field of Classification Search
CPC ........................ H10K 77/111; G02F 1/133305
See application file for complete search history.

(56) References Cited

U.S. PATENT DOCUMENTS

| | | | |
|---|---|---|---|
| 10,941,069 B2 | 3/2021 | Kumkar | |
| 2017/0042047 A1 * | 2/2017 | Oh | G09G 3/20 |
| 2017/0358772 A1 * | 12/2017 | Sung | H10K 59/124 |
| 2018/0138456 A1 | 5/2018 | Chung et al. | |
| 2019/0067607 A1 | 2/2019 | Park et al. | |
| 2020/0051810 A1 | 2/2020 | Um et al. | |
| 2021/0249613 A1 * | 8/2021 | Kwon | H10K 59/8731 |
| 2021/0408405 A1 * | 12/2021 | Hu | H10K 59/1201 |
| 2022/0135664 A1 | 5/2022 | Vukicevic et al. | |

* cited by examiner

*Primary Examiner* — Mariceli Santiago
(74) *Attorney, Agent, or Firm* — Womble Bond Dickinson (US) LLP

(57) ABSTRACT

Provided is a display device including a first substrate including a first sub-substrate and a second sub-substrate spaced apart from each other, a second substrate above the first substrate, a display layer above the second substrate, and configured to display an image, and a reflective layer at a first surface of the second substrate facing the first substrate, and including at least a portion that does not overlap the first substrate.

8 Claims, 39 Drawing Sheets

SUB1: SSU1, SSU2

SUB1: SSU1, SSU2

SUB1: SSU1, SSU2

SUB1: SSU1, SSU2

DISPLAY DEVICE AND METHOD FOR MANUFACTURING THE SAME

CROSS-REFERENCE TO RELATED APPLICATION

This application claims priority to, and the benefit of, Korean Patent Application No. 10-2022-0117011 filed on Sep. 16, 2022, in the Korean Intellectual Property Office, the contents of which in its entirety are herein incorporated by reference.

BACKGROUND

1. Field

The present disclosure relates to a display device, and a method for manufacturing the same.

2. Description of the Related Art

As the information society develops, the demand for a display device for displaying an image is increasing in various forms. The display device may be a flat panel display, such as a liquid crystal display device, a field emission display device, or a light-emitting display panel.

The display device includes a display area for displaying an image, and a non-display area arranged to surround the periphery of the display area. Recently, the width of the non-display area is gradually decreasing to increase immersion in the display area, and to increase an aesthetic of the display device.

Meanwhile, the display device may be formed by cutting each display cell from a mother substrate on which a plurality of display cells are formed. In the cutting process, a cutting wheel or a laser may be used, but the display device may be damaged in this process.

SUMMARY

Aspects of embodiments of the present disclosure provide a display device capable of reducing or preventing damage to a display device, while improving mechanical strength, during a cutting process of the display device, and a method of manufacturing the same.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to an aspect of the present disclosure, a display device includes a first substrate including a first sub-substrate and a second sub-substrate spaced apart from each other, a second substrate above the first substrate, a display layer above the second substrate, and configured to display an image, and a reflective layer at a first surface of the second substrate facing the first substrate, and including at least a portion that does not overlap the first substrate.

The first substrate may define a separation part at which the first sub-substrate and the second sub-substrate are separated and spaced apart, wherein the reflective layer overlaps the separation part.

The separation part of the first substrate may overlap a bending area at which the second substrate is bent.

The reflective layer may include at least one selected from molybdenum (Mo), silver (Ag), copper (Cu), aluminum (Al), nickel (Ni), lanthanum (La), titanium (Ti), niobium (Nb), chromium (Cr), gold (Au), neodymium (Nd), platinum (Pt), tungsten (W), vanadium (V), and/or iron (Fe).

The reflective layer may be made of a plurality, the plurality of reflective layers including a first reflective layer and a second reflective layer spaced apart from each other.

The first reflective layer may overlap the first sub-substrate, and the second reflective layer may overlap the second sub-substrate.

The first sub-substrate may be in a display area overlapping the display layer, and the second sub-substrate may be in a non-display area other than the display area.

The reflective layer may have a shape of a concave mirror or a flat mirror.

The display device may further include an organic pattern above the reflective layer, wherein the reflective layer is between the organic pattern and the second substrate.

The organic pattern may have a curved surface, and may protrude toward a second surface opposite to the first surface of the second substrate.

The organic pattern may have a shape of a lenticular lens or a micro lens.

According to an aspect of the present disclosure, a display device includes a first substrate including a first sub-substrate and a second sub-substrate spaced apart from each other, a second substrate above the first substrate, and defining a groove at a first surface of the second substrate facing the first substrate, at least a portion of the groove not overlapping the first substrate, and a display layer above the second substrate and configured to display an image.

The first substrate may define a separation part at which the first sub-substrate and the second sub-substrate are separated and spaced apart from each other, wherein the groove overlaps the separation part.

The separation part of the first substrate may overlap a bending area at which the second substrate is bent.

The groove may be made of a plurality, the plurality of grooves including a first groove and a second groove spaced apart from each other.

The first groove may overlap the first sub-substrate, and the second groove may overlap the second sub-substrate.

The first sub-substrate may be in a display area overlapping the display layer, and the second sub-substrate may be in a non-display area other than the display area.

The groove may be defined by a curved surface having a concave shape toward a second surface of the second substrate that is opposite to the first surface of the second substrate.

The first sub-substrate and the second sub-substrate may respectively include a first inclined surface between a side surface and an upper surface thereof, and a second inclined surface between the side surface and a bottom surface thereof.

According to an aspect of the present disclosure, a method for manufacturing a display device includes forming reflective layers above a first surface of a mother substrate, forming a sub-material layer above the reflective layers, forming a display layer above the sub-material layer to form display cells, forming laser irradiation areas in the display cells by irradiating a laser onto a second surface of the mother substrate facing the first surface, and separating the display cells from the mother substrate by spraying an etchant on the second surface of the mother substrate.

The laser may generate and irradiate a first focal point on the mother substrate, and may be reflected by the reflective layers to generate a second focal point on the mother substrate.

The laser irradiation areas may include a first laser irradiation area to which the laser of the first focal point is irradiated, and a second laser irradiation area to which the laser of the second focal point is irradiated.

The laser irradiated areas may have a faster etching rate by the etchant than areas to which the laser is not irradiated.

The method may further include removing the reflective layers by etching with the etchant such that an area from which the reflective layers are removed defines grooves.

The method may further include forming organic patterns above the first surface of the mother substrate before forming the reflective layers, wherein the reflective layers are formed above the organic patterns.

The display cells may be formed of a first substrate including a first sub-substrate and a second sub-substrate separated from the mother substrate and spaced apart from each other, wherein the sub-material layer includes a second substrate. The display device, and a method of manufacturing the same, according to one or more embodiments, may facilitate a process for cutting a substrate, and may improve impact resistance of the substrate by a multi-focal laser light by placing a reflective layer between a first substrate and a second substrate to which the laser is irradiated.

In addition, it is possible to reduce or prevent damage to the signal lines by blocking the laser light from being irradiated to the signal lines located on the bending area.

The aspects of the present disclosure are not limited to the aforementioned aspects, and various other aspects are included in the present specification.

DETAILED DESCRIPTION

Figure 1:
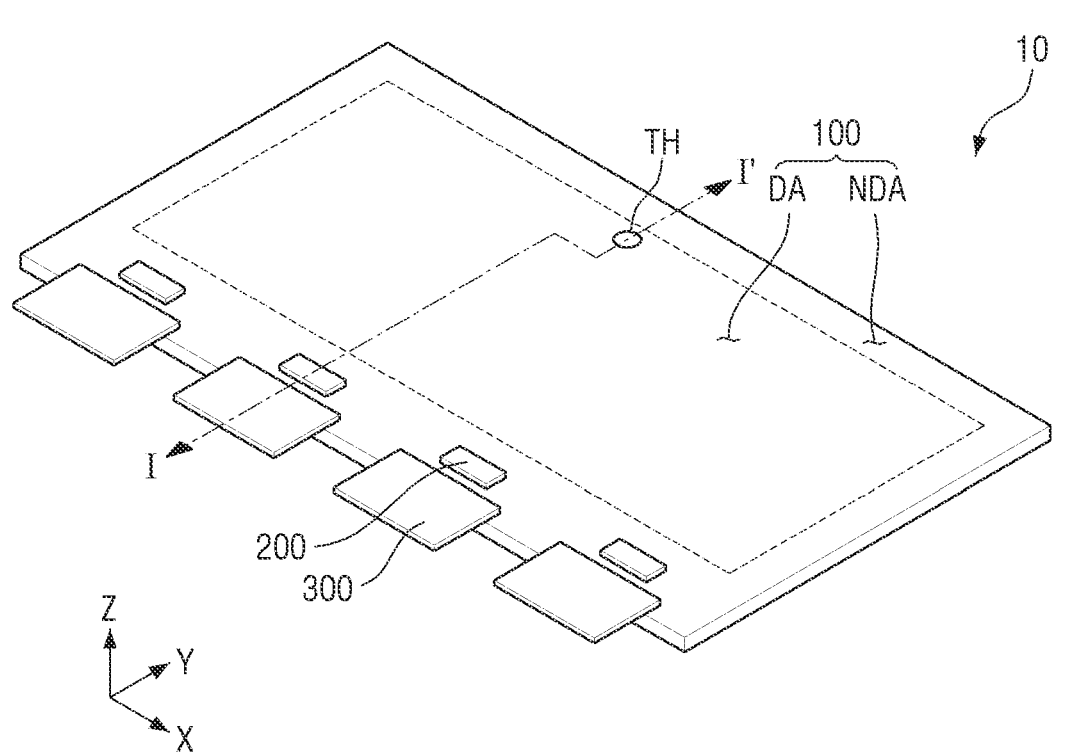
FIG. 1 is a perspective view illustrating a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" (e.g., in plan view) and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
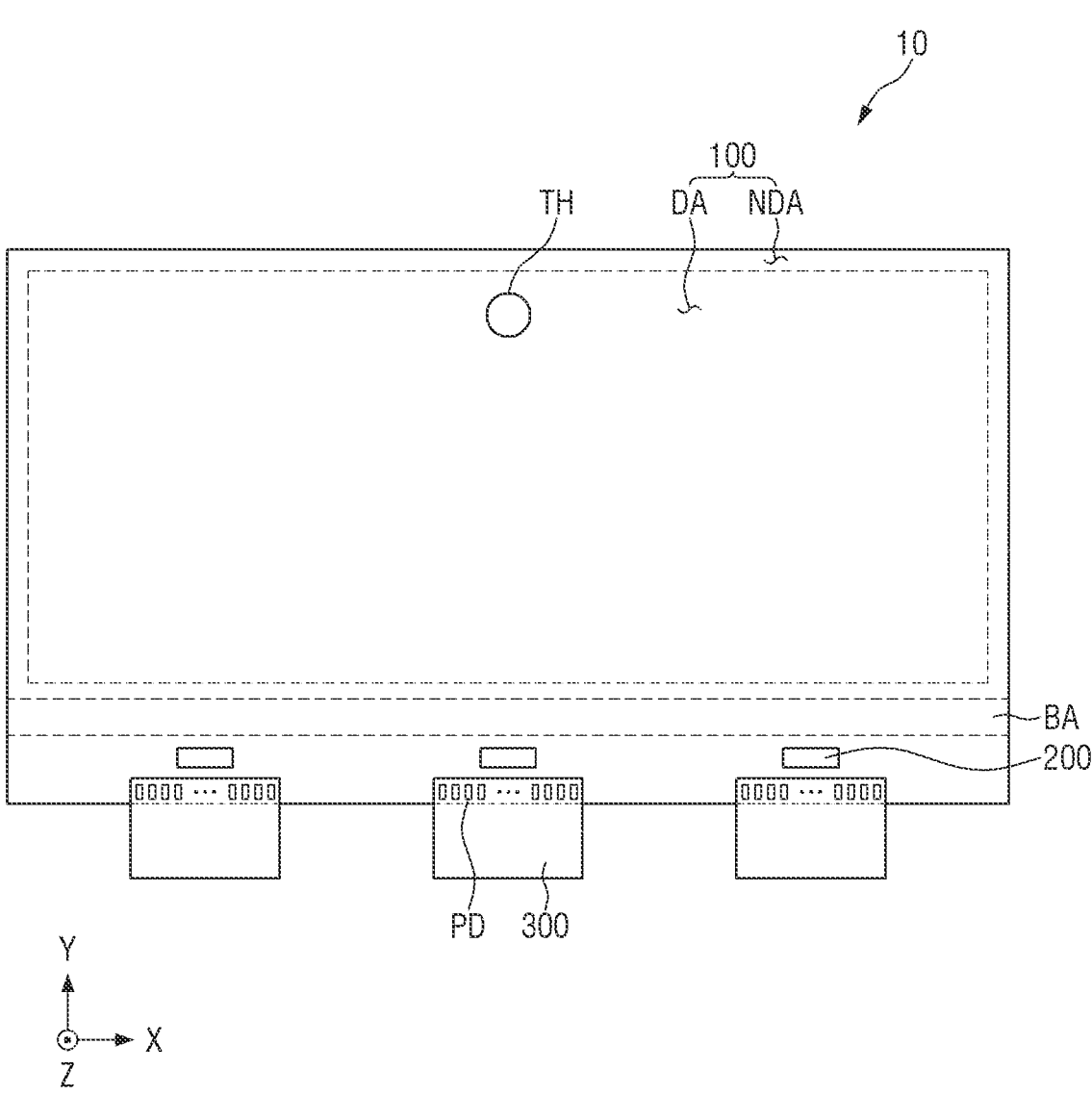
FIG. 2 is a plan view illustrating a display panel according to one or more embodiments.

FIG. 1 is a perspective view illustrating a display device according to one or more embodiments. FIG. 2 is a plan view illustrating a display panel according to one or more embodiments.

Referring to FIGS. 1 and 2, a display device 10 is a device for displaying a moving image or a still image. The display device may be used as a display screen of various products, such as televisions, laptop computers, monitors, billboards and the Internet of Things (IOT) as well as portable electronic devices, such as mobile phones, smart phones, tablet personal computer (tablet PC), smart watches, watch phones, mobile communication terminals, electronic notebooks, electronic books, portable multimedia players (PMP), navigation systems and ultra mobile PCs (UMPC).

The display device 10 according to one or more embodiments may be a light-emitting display device, such as an organic light-emitting display device using an organic light-emitting diode, a quantum dot light-emitting display including a quantum dot light-emitting layer, an inorganic light-emitting display device including an inorganic semiconductor, and a micro light-emitting display device using a micro or nano light-emitting diode (micro LED or nano LED). Hereinafter, the display device 10 has been mainly described as an organic light-emitting display device, but the present disclosure is not limited thereto.

The display device 10 according to one or more embodiments includes a display panel 100, a driving integrated circuit (IC) 200, and a circuit board 300.

The display panel 100 may be formed in a rectangular plane having a long side in a first direction (X-axis direction) and a short side in a second direction (Y-axis direction) intersecting the first direction (X-axis direction). A corner where the long side of the first direction (X-axis direction) and the short side of the second direction (Y-axis direction) meet may be formed at a right angle, or may be rounded to have a curvature. The flat shape of the display panel 100 is not limited to a quadrangle, and may be formed in other polygons, circles, or ovals.

The display panel 100 may be formed to be flat, but is not limited thereto. For example, the display panel 100 is formed at left and right ends and may include curved portions having a constant curvature or a varying curvature. In addition, the display panel 100 may be flexibly formed to be bent, folded, or rolled.

The display panel 100 may include a display area DA displaying an image, and a non-display area NDA located around the display area DA.

The display area DA may occupy most of the area of the display panel 100. The display area DA may be located in the center of the display panel 100. Pixels each including a plurality of emission areas may be located in the display area DA to display an image.

The non-display area NDA may be located adjacent to the display area DA. The non-display area NDA may be an area outside the display area DA. The non-display area NDA may surround the display area DA in plan view. The non-display area NDA may be an edge area of the display panel 100.

Display pads DP may be located in the non-display area NDA to be connected to the circuit boards 300. The display pads DP may be located on one edge of the display panel 100. For example, the display pads DP may be located on the lower edge of the display panel 100.

The driving integrated circuits ICs 200 may generate data voltages, power supply voltages, scan timing signals, and the like. The driving ICs 200 may output data voltages, power supply voltages, scan timing signals, and the like.

The driving IC 200 may be located between the display pads PD and the display area DA in the non-display area NDA. Each of the driving ICs 200 may be attached to the non-display area NDA of the display panel 100 in a chip-on-glass (COG) method. Alternatively, each of the driving ICs 200 may be attached to the circuit board 300 using a chip-on-plastic (COP) method.

The circuit boards 300 may be located on the display pads DP located on one edge of the display panel 100. The circuit boards 300 may be attached to the display pads PD using an anisotropic conductive film and a conductive adhesive member, such as an anisotropic conductive adhesive. Accordingly, the circuit boards 300 may be electrically connected to signal lines of the display panel 100. The circuit boards 300 may be a flexible film, such as a flexible printed circuit board or a chip on film.

A bending area BA may be located between a driving IC 200 and the display area DA in the non-display area NDA. The bending area BA may be an area in which the driving IC 200 and the circuit board 300 are bent to be located under a substrate SUB. The bending area BA may be an area in which a first substrate SUB1 is removed so that a second substrate SUB2 of the substrates SUB is bent.

A through hole TH may be located at one side of the display area DA. The through hole TH is a hole that may transmit light, and may be an area in which an optical device is located.

Figure 3:
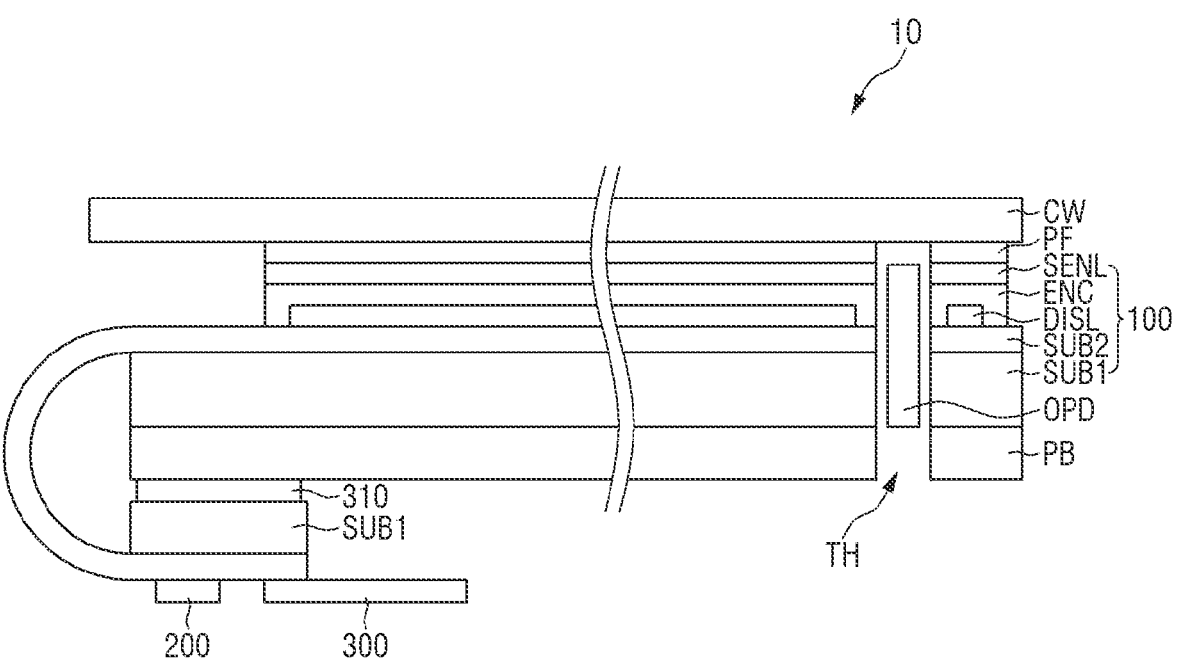
FIG. 3 is a cross-sectional view illustrating an example of a display device taken along line I-I' of FIG. 1.

FIG. 3 is a cross-sectional view illustrating an example of a display device taken along line I-I' of FIG. 1. FIG. 3 is a cross-sectional view illustrating an example of a display device having one end bent.

Referring to FIG. 3, the display device 10 according to one or more embodiments may include the display panel 100, a polarizing film PF, a cover window CW, and a panel bottom cover PB. The display panel 100 may include the substrate SUB, a display layer DISL, an encapsulating layer ENC, and a sensor electrode layer SENL.

The substrate SUB may include the first substrate SUB1 and the second substrate SUB2. The substrate SUB is a substrate having a rigid characteristic, and may be, for example, a glass substrate. The second substrate SUB2 is a substrate having a flexible characteristic, and may be, for example, a polyimide substrate.

The display layer DISL may be located on the first surface of the substrate SUB. The display layer DISL may be a layer that displays an image. The display layer DISL may include a thin film transistor layer (TFTL in FIG. 4) in which thin film transistors are formed, and a light-emitting element layer (EML in FIG. 4) in which light-emitting elements that emit light are located in the light-emitting areas.

In the display area DA of the display layer DISL, scan lines, data lines, power lines, etc. for the emission areas to emit light may be located. In the non-display area NDA of the display layer DISL, a scan driving circuit unit for outputting scan signals to the scan lines, and fan-out lines connecting the data lines and the driving IC 200 may be located.

The encapsulating layer ENC may be a layer for encapsulating the light-emitting element layer of the display layer DISL to reduce or prevent oxygen or moisture from penetrating into the light-emitting element layer of the display layer DISL. The encapsulating layer ENC may be located on the display layer DISL. The encapsulating layer ENC may be located on the upper surface and side surfaces of the display layer DISL. The encapsulating layer ENC may cover the display layer DISL.

The sensor electrode layer SENL may be located on the display layer DISL. The sensor electrode layer SENL may include sensor electrodes. The sensor electrode layer SENL may sense a user's touch using sensor electrodes.

The polarizing film PF may be located on the display panel 100 to reduce reflection of external light. The polarizing film PF may include a first base member, a linear polarizing plate, a phase delay film, such as a $\lambda/4$ plate (quarter-wave plate), and a second base member. The first base member, the phase delay film, the linear polarizing plate, and the second base member of the polarizing film PF may be sequentially stacked on the display panel 100.

The cover window CW may be located on the polarizing film PF. The cover window CW may be attached to the polarizing film PF by a transparent adhesive member, such as an optically clear adhesive (OCA) film.

The panel bottom cover PB may be located on the second surface of the substrate SUB of the display panel 100. The second surface of the substrate SUB may be opposite to the first surface. The panel bottom cover PB may be attached to the second surface of the substrate SUB of the display panel 100 through the adhesive member. The adhesive member may be a pressure sensitive adhesive (PSA).

The panel bottom cover PB may include at least one of a light-blocking member for absorbing light incident from the outside, a buffer member for absorbing an impact from the outside, and a heat dissipation member for efficiently dissipating heat of the display panel 100.

The light-blocking member may be located under the display panel 100. The light-blocking member blocks light transmission to reduce or prevent visibility of components located under the light-blocking member, such as, for example, the circuit board 300 (e.g., when viewed above the display panel 100). The light-blocking member may include a light-absorbing material, such as a black pigment or a black dye.

The buffer member may be located under the light-blocking member. The buffer member absorbs an external shock to reduce or prevent the likelihood of the display panel 100 being damaged. The buffer member may be formed of a single layer or a plurality of layers. For example, the buffer member is formed of a polymer resin, such as polyurethane, polycarbonate, polypropylene, polyethylene, or the like, or may include a material having elasticity, such as rubber, a urethane-based material, or a sponge formed by foam molding an acrylic-based material.

The heat dissipation member may be located under the buffer member. The heat dissipation member may include a first heat dissipation layer including graphite or carbon nanotubes, and a second heat dissipation layer formed of a thin metal film, such as copper, nickel, ferrite, or silver, which may shield electromagnetic waves and has excellent thermal conductivity.

The driving IC 200 and the circuit board 300 may be bent under the display panel 100. The circuit board 300 may be attached to the lower surface of the panel bottom cover PB by an adhesive member 310. The adhesive member 310 may be a pressure-sensitive adhesive.

The through hole TH may be located in the display device 10 according to one or more embodiments. The through hole TH is a hole that allows light to pass through, and may be a physical hole penetrating through the panel bottom cover PB and the polarizing film PF, as well as the display panel 100. However, the present disclosure is not limited thereto, and the through hole TH may pass through the panel bottom cover PB while not passing through the display panel 100 and the polarizing film PF. The cover window CW may cover the through hole TH.

The through hole TH may pass through the substrate SUB, the display layer DISL, the encapsulating layer ENC, and the sensor electrode layer SENL of the display panel 100.

The electronic device including the display device 10 according to one or more embodiments may further include an optical device OPD located in the through hole TH. The optical device OPD may be spaced apart from the display panel 100, the panel bottom cover PB, and the polarizing film PF. The optical device OPD may be an optical sensor that detects light incident through the through hole TH, such as a proximity sensor, an illuminance sensor, and a camera sensor.

Figure 4:
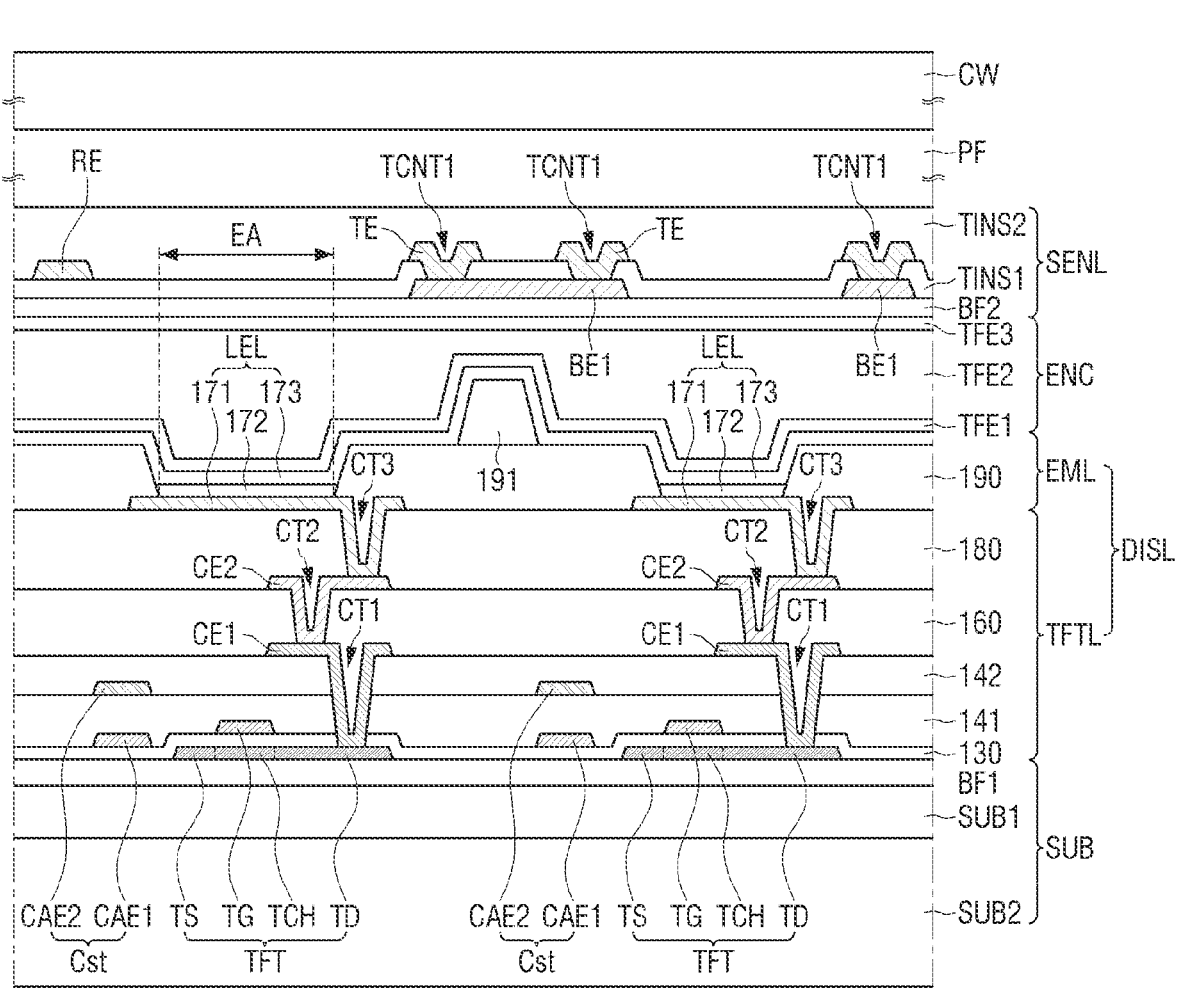
FIG. 4 is a cross-sectional view illustrating an example of a display area of a display panel according to one or more embodiments.

FIG. 4 is a cross-sectional view illustrating an example of a display area of a display panel according to one or more embodiments.

Referring to FIG. 4, the display panel 100 according to one or more embodiments may be an organic light-emitting display panel including a light-emitting element LEL including an organic light-emitting layer 172.

The display layer DISL may include a thin film transistor layer TFTL including a plurality of thin film transistors and a light-emitting element layer EML including a plurality of light-emitting elements.

A first buffer layer BF1 may be located on the second substrate SUB2 of the substrate SUB. The first buffer layer BF1 may be formed of an inorganic material, such as a silicon nitride layer, a silicon oxynitride layer, a silicon oxide layer, a titanium oxide layer, and an aluminum oxide layer. Alternatively, the first buffer layer BF1 may be formed as a multilayer in which a plurality of layers of a silicon nitride layer, a silicon oxynitride layer, a silicon oxide layer, a titanium oxide layer, and an aluminum oxide layer are alternately stacked.

An active layer including a channel area TCH, a source area TS, and a drain area TD of the thin film transistor TFT may be located on the first buffer layer BF1. The active layer may be formed of polycrystalline silicon, single crystal silicon, low temperature polycrystalline silicon, amorphous silicon, or an oxide semiconductor material. When the active layer includes polycrystalline silicon or an oxide semiconductor material, the source area TS and the drain area TD in the active layer may be conductive areas doped with ions or impurities to have conductivity.

A gate-insulating layer 130 may be located on the active layer of the thin film transistor TFT. The gate-insulating layer 130 may be formed of an inorganic layer, for example, a silicon nitride layer, a silicon oxynitride layer, a silicon oxide layer, a titanium oxide layer, or an aluminum oxide layer.

A first gate metal layer including a gate electrode TG of the thin film transistor TFT, a first capacitor electrode CAE1 of the capacitor Cst, and scan lines may be located on the gate-insulating layer 130. The gate electrode TG of the thin film transistor TFT may overlap the channel area TCH in the third direction (Z-axis direction). The first gate metal layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

A first interlayer insulating layer 141 may be located on the first gate metal layer. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may include a plurality of inorganic layers.

A second gate metal layer including a second capacitor electrode CAE2 of the capacitor Cst may be located on the first interlayer insulating layer 141. The second capacitor electrode CAE2 may overlap the first capacitor electrode CAE1 in the third direction (Z-axis direction). Therefore, the capacitor Cst may be formed by the first capacitor electrode CAE1, the second capacitor electrode CAE2, and an inorganic insulating dielectric layer located therebetween and serving as a dielectric layer. The second gate metal layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

A second interlayer insulating layer 142 may be located on the second gate metal layer. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may include a plurality of inorganic layers.

A first data metal layer including a first connection electrode CE1 and data lines may be located on the second interlayer insulating layer 142. The first connection electrode CE1 may be connected to the drain area TD through a first contact hole CT1 penetrating the gate-insulating layer 130, the first interlayer insulating layer 141, and the second interlayer insulating layer 142. The first data metal layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

A first organic layer 160 for flattening a step difference due to a thin film transistors TFT may be located on the first connection electrode CE1. The first organic layer 160 may be formed of an organic layer, such as acryl resin, epoxy resin, phenolic resin, polyamide resin, polyimide resin, etc.

A second data metal layer including a second connection electrode CE2 may be located on the first organic layer 160. The second data metal layer may be connected to the first connection electrode CE1 through a second contact hole CT2 penetrating the first organic layer 160. The second data metal layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

A second organic layer 180 may be located on the second connection electrode CE2. The second organic layer 180 may be formed of an organic layer, such as acryl resin, epoxy resin, phenolic resin, polyamide resin, polyimide resin, etc.

Meanwhile, the second data metal layer and the second organic layer 180 including the second connection electrode CE2 may be omitted.

The light-emitting element layer EML is located on the thin film transistor layer TFTL. The light-emitting element layer EML may include light-emitting elements LEL and a bank 190.

Each of the light-emitting elements LEL may include a pixel electrode 171, a light-emitting layer 172, and a common electrode 173. Each of the emission areas EA represents an emission area where holes from the pixel electrode 171 and electrons from the common electrode 173 are combined with each other in the light-emitting layer 172 to emit light by sequentially stacking the pixel electrode 171, the light-emitting layer 172, and the common electrode 173. In this case, the pixel electrode 171 may be an anode electrode, and the common electrode 173 may be a cathode electrode.

A pixel electrode layer including the pixel electrode 171 may be formed on the second organic layer 180. The pixel electrode 171 may be connected to the second connection electrode CE2 through a third contact hole CT3 penetrating the second organic layer 180. The pixel electrode layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

In a top emission structure that emits light in the direction of the common electrode 173 based on the light-emitting layer 172, the pixel electrode 171 may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/Al/ITO), APC alloy, a stacked structure of APC alloy, and ITO (ITO/APC/ITO) to increase reflectivity. The APC alloy is an alloy of silver (Ag), palladium (Pd), and/or copper (Cu).

The bank 190 serves to define the emission areas EA of the pixels. To this end, the bank 190 may be formed to expose a partial area of the pixel electrode 171 on the second organic layer 180. The bank 190 may cover the edge of the pixel electrode 171. The bank 190 may be located in the third contact hole CT3. That is, the third contact hole CT3 may be filled by the bank 190. The bank 190 may be formed of an organic layer, such as an acrylic resin, an epoxy resin, a phenolic resin, a polyamide resin, or a polyimide resin.

A spacer 191 may be located on the bank 190. The spacer 191 may serve to support a mask during the process of manufacturing a light-emitting layer 172. The spacer 191 may be formed of an organic layer, such as an acrylic resin, an epoxy resin, a phenolic resin, a polyamide resin, or a polyimide resin.

The light-emitting layer 172 is formed on the pixel electrode 171. The light-emitting layer 172 may include an organic material to emit a color (e.g., predetermined color). For example, the light-emitting layer 172 may include a hole-transporting layer, an organic material layer, and an electron-transporting layer. The organic material layer may include a host and a dopant. The organic material layer may include a material for emitting light (e.g., predetermined light), and may be formed using a phosphorescent material or a fluorescent material.

The common electrode 173 is formed on the light-emitting layer 172. The common electrode 173 may be formed to cover the light-emitting layer 172. The common electrode 173 may be a common layer commonly formed in the emission areas EA. A capping layer may be formed on the common electrode 173.

In the upper light-emitting structure, the common electrode 173 may be formed of a transparent conductive material (TCO), such as ITO or IZO that may transmit light, or a semi-transmissive conductive material, such as magnesium (Mg), silver (Ag), or an alloy of magnesium (Mg) and silver (Ag). When the common electrode 173 is formed of a transflective metal material, light output efficiency may be increased by a microcavity.

The encapsulating layer ENC may be located on the light-emitting element layer EML. The encapsulating layer ENC may include at least one inorganic layer TFE1 and TFE3 to reduce or prevent oxygen or moisture from penetrating into the light-emitting element layer EML. Also, the encapsulating layer ENC may include at least one organic layer TFE2 to protect the light-emitting element layer EML from foreign substances, such as dust. For example, the encapsulating layer ENC may include a first encapsulating inorganic layer TFE1, an encapsulating organic layer TFE2, and a second encapsulating inorganic layer TFE3.

The first encapsulating inorganic layer TFE1 may be located on the common electrode 173, the encapsulating organic layer TFE2 may be located on the first encapsulating inorganic layer TFE1, and the second encapsulating inorganic layer TFE3 may be located on the encapsulation organic layer TFE2. The first encapsulating inorganic layer TFE1 and the second encapsulating inorganic layer TFE3 may be formed as a multilayer in which one or more inorganic layers of a silicon nitride layer, a silicon oxynitride layer, a silicon oxide layer, a titanium oxide layer, and an aluminum oxide layer are alternately stacked. The encapsulating organic layer TFE2 may be an organic film, such as an acrylic resin, an epoxy resin, a phenolic resin, a polyamide resin, or a polyimide resin.

The sensor electrode layer SENL may be located on the encapsulating layer ENC. The sensor electrode layer SENL may include sensor electrodes TE and RE.

A second buffer layer BF2 may be located on the encapsulating layer ENC. The second buffer layer BF2 may include at least one inorganic layer. For example, the second buffer layer BF2 may be formed as a multilayer in which one or more inorganic layers of a silicon nitride layer, a silicon oxynitride layer, a silicon oxide layer, a titanium oxide layer, and an aluminum oxide layer are alternately stacked. The second buffer layer BF2 may be omitted.

A first connection parts BE1 may be located on the second buffer layer BF2. The first connection parts BE1 may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/Al/ITO), APC alloy, a stacked structure of APC alloy, and ITO (ITO/APC/ITO).

A first sensor insulating layer TINS1 may be located on the first connection parts BE1. The first sensor insulating layer TINS1 may be formed of an inorganic layer, for example, a silicon nitride layer, a silicon oxynitride layer, a silicon oxide layer, a titanium oxide layer, or an aluminum oxide layer.

The sensor electrodes, that is, a driving electrodes TE and sensing electrodes RE, may be located on the first sensor insulating layer TNIS1. In addition, dummy patterns may be located on the first sensor insulating layer TNIS1. The driving electrodes TE, the sensing electrodes RE, and the dummy patterns do not overlap the emission areas EA. The driving electrodes TE, the sensing electrodes RE, and the dummy patterns may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/Al/ITO), APC alloy, a stacked structure of APC alloy, and ITO (ITO/APC/ITO).

A second sensor insulating layer TINS2 may be located on the driving electrodes TE, the sensing electrodes RE, and the dummy patterns. The second sensor insulating layer TINS2 may include at least one of an inorganic layer and an organic layer. The inorganic layer may be a silicon nitride layer, a silicon oxynitride layer, a silicon oxide layer, a titanium oxide layer, or an aluminum oxide layer. The organic layer may be an acrylic resin, an epoxy resin, a phenolic resin, a polyamide resin, or a polyimide resin.

Figure 5:
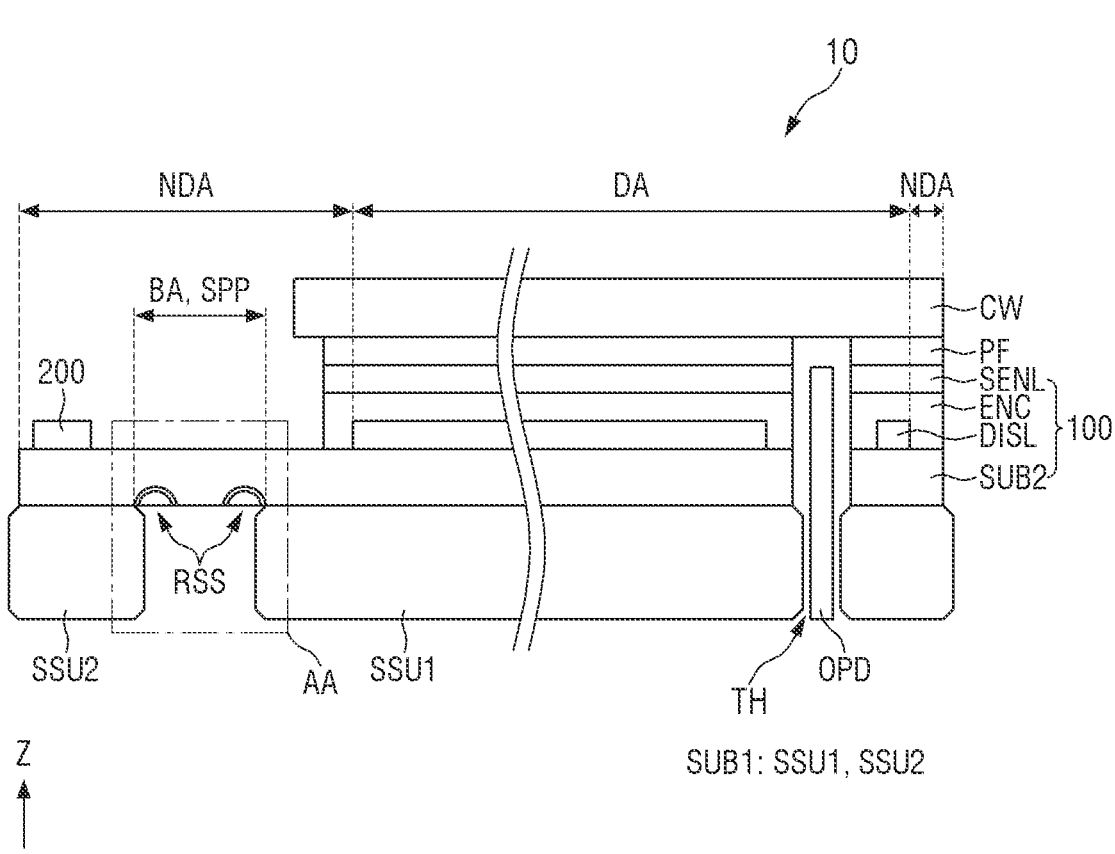
FIG. 5 is a cross-sectional view illustrating a display device according to one or more embodiments.
Figure 6:
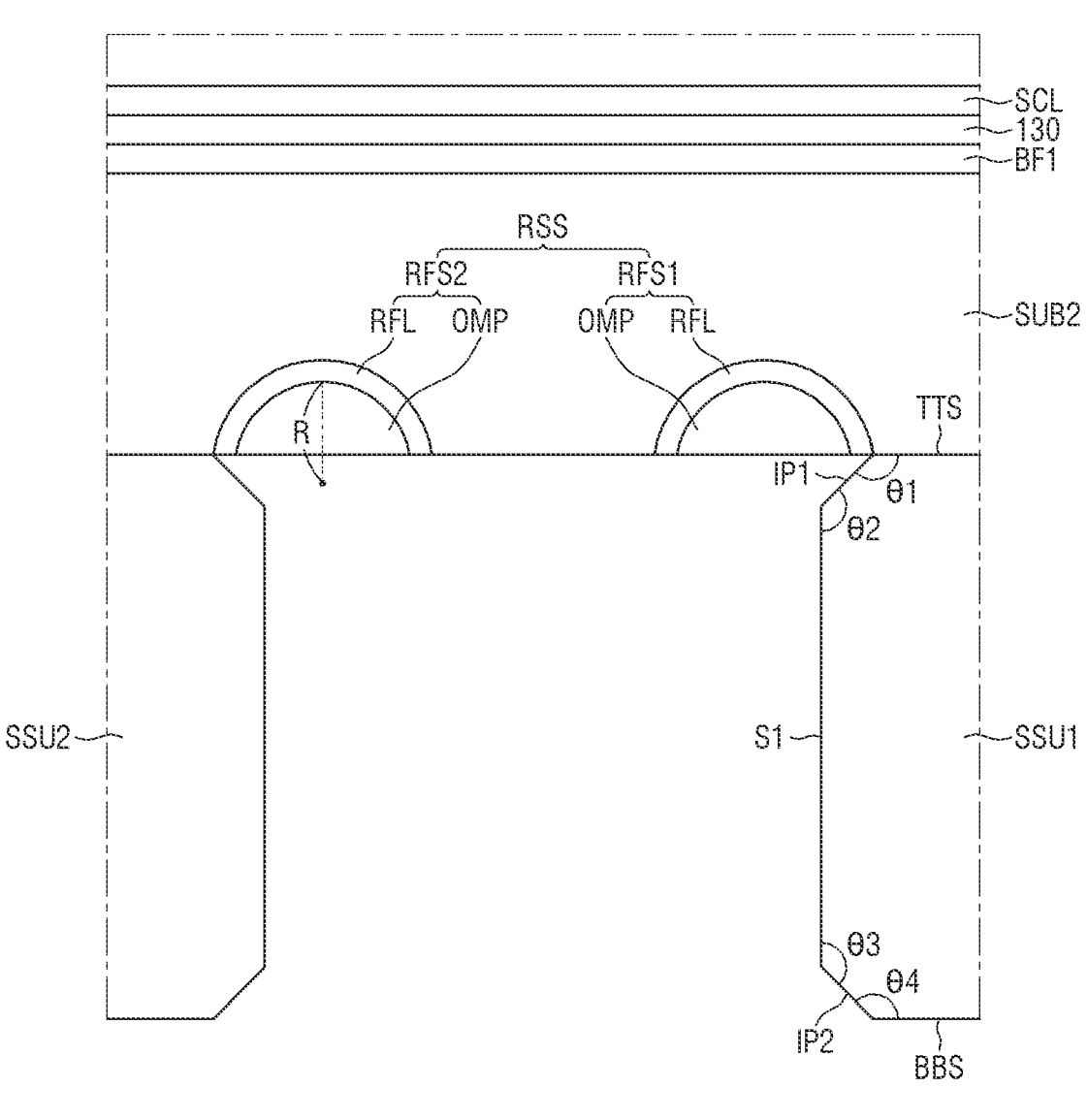
FIG. 6 is an enlarged view of area AA of FIG. 5.
Figure 7:
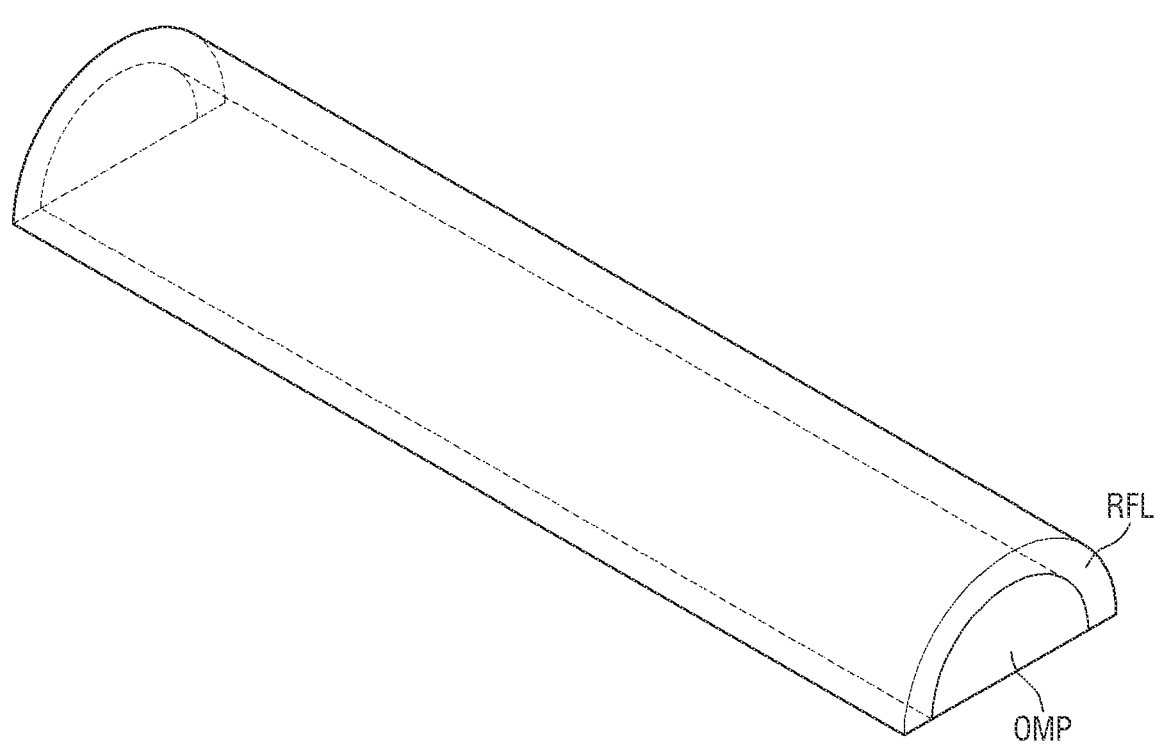
FIGS. 7 and 8 are views illustrating various shapes of an organic pattern according to one or more embodiments.
Figure 8:
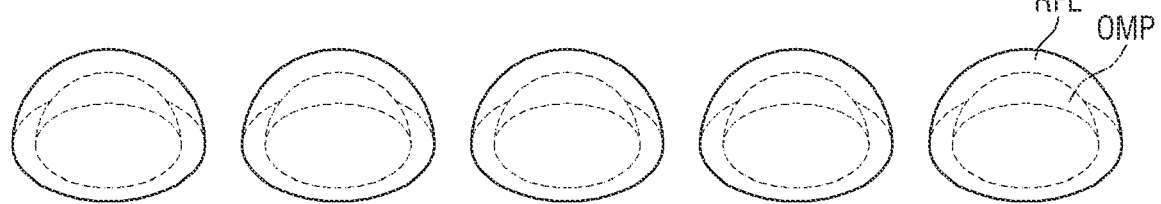

FIG. 5 is a cross-sectional view illustrating a display device according to one or more embodiments. FIG. 6 is an enlarged view of area AA of FIG. 5. FIGS. 7 and 8 are views illustrating various shapes of an organic pattern according to one or more embodiments.

In FIG. 5, the bending area BA of the display device 10 is shown in a flat state.

Referring to FIGS. 5 and 6, the display device 10 may include the first substrate SUB1, the second substrate SUB2 located on the first substrate SUB1, and a plurality of reflective structures RSS located on, or at, one surface of the second substrate SUB2.

The first substrate SUB1 may include a first sub-substrate SSU1 and a second sub-substrate SSU2. The first sub-substrate SSU1 may overlap the display area DA, and the second sub-substrate SSU2 may overlap the driving IC 200. The first substrate SUB1 may include a separation part SPP in which the first sub-substrate SSU1 and the second sub-substrate SSU2 are separated in an area corresponding to the bending area BA. The separation part SPP is an area at which a portion of the first substrate SUB1 is removed, and may be an area where the first sub-substrate SSU1 and the second sub-substrate SSU2 are spaced apart from each other. The separation part SPP of the first substrate SUB1 may expose a portion of the second substrate SUB2.

The second substrate SUB2 may be located on the first substrate SUB1. The second substrate SUB2 may extend from the first sub-substrate SSU1 of the first substrate SUB1 to the second sub-substrate SSU2. An area corresponding to the bending area BA of the second substrate SUB2 may be exposed by the separation part SPP of the first substrate SUB1. An area corresponding to the bending area BA of the second substrate SUB2 may be flexibly bent by the separation part SPP of the first substrate SUB1.

The plurality of reflective structures RSS may be located on, or at, one surface of the second substrate SUB2. The plurality of reflective structures RSS may overlap the bending area BA of the display device 10, and may be spaced apart from each other. However, the present disclosure is not limited thereto, and the plurality of reflective structures RSS may contact each other.

The plurality of reflective structures RSS may include a first reflective structure RFS1 and a second reflective structure RFS2. The first reflective structure RFS1 is located to overlap the first sub-substrate SSU1 in the third direction (Z-axis direction), and the second reflective structure RFS2 may be spaced apart from the first reflective structure RFS1 and may overlap the second sub-substrate SSU2 in the third direction (Z-axis direction).

Each of the reflective structures RFS1 and RFS2 may include an organic pattern OMP and a reflective layer RFL located on the organic pattern OMP.

The organic pattern OMP may be located on, or at, one surface of the second substrate SUB2. The organic pattern OMP may have a shape convexly protruding from one surface of the second substrate SUB2 in the third direction (Z-axis direction). The organic pattern OMP may have a convex shape including a curved surface having a curvature (e.g., predetermined curvature). For example, as shown in FIG. 7, the organic pattern OMP may have the same shape as a lenticular lens. In this case, the organic pattern OMP may be formed linearly along the bending area BA on, or at, one surface of the second substrate SUB2. In addition, the organic pattern OMP may have the same shape as a micro lens as shown in FIG. 8. In this case, the organic patterns OMP may be spaced apart from or in contact with each other in a dot shape along the bending area BA on, or at, one surface of the second substrate SUB2. The shape of the organic pattern OMP may function to form the reflective layer RFL in the shape of a concave mirror.

The organic pattern OMP may be formed of the organic material. The organic pattern OMP may be formed of, for example, an acrylic resin, an epoxy resin, a phenolic resin, a polyamide resin, a polyimide resin, etc.

The reflective layer RFL may be located on the organic pattern OMP. The reflective layer RFL may cover the organic pattern OMP. The reflective layer RFL may overlap the separation part SPP of the first substrate SU B1. The shape of the reflective layer RFL may vary according to the shape of the organic pattern OMP. For example, as shown in FIG. 7, the reflective layer RFL has a shape that covers the lenticular lens-shaped organic pattern OMP, or the reflective layer RFL may have a shape that covers the organic pattern OMP having a microlens shape as shown in FIG. 8. For example, the reflective layer RFL may have a hollow semi-cylindrical shape, or a hollow dome shape.

The reflective layer RFL may cover the convex shape of the organic pattern OMP so that the first surface SS1 in contact with the organic pattern OMP may have the curved surface. The first surface SS1 of the reflective layer RFL may have a radius of curvature R (e.g., predetermined radius of curvature), and the radius of curvature R may be variously adjusted to adjust a focal length of a laser light, which will be described later.

The reflective layer RFL may include the metal material capable of reflecting light. For example, the reflective layer RFL may be formed of a single layer or multiple layers thereof including at least one selected from molybdenum (Mo), silver (Ag), copper (Cu), aluminum (Al), nickel (Ni), lanthanum (La), titanium (Ti), niobium (Nb), chromium (Cr), gold (Au), neodymium (Nd), platinum (Pt), tungsten (W), vanadium (V), and iron (Fe). For example, the reflective layer RFL may include any one of molybdenum (Mo), aluminum (Al), and/or copper (Cu).

Meanwhile, the first buffer layer BF1 may be located on the second substrate SUB2, the gate-insulating layer 130 may be located on the first buffer layer BF1, and a signal line SCL may be located on the gate-insulating layer 130. The signal line SCL may function to transmit various signals transmitted from the driving IC 200 or the circuit board 300.

The above-described reflective layer RFL may not only adjust the focal length of laser light, which will be described later, but may also block the laser light from being irradiated to the signal line SCL. When the laser light is irradiated to the signal line SCL, the signal line SCL may be damaged by the high heat of the laser light. Accordingly, it is possible to reduce or prevent damage to the signal lines SCL by reducing or preventing the laser light irradiated to the signal lines SCL.

Meanwhile, the first sub-substrate SSU1 and the second sub-substrate SU2 may include lateral sides and inclined surfaces. In the presently described one or more embodiments, the first sub-substrate SSU1 will be described as an example with reference to FIG. 6.

As shown in FIG. 6, the first sub-substrate SSU1 may include an upper surface TTS, a bottom surface BBS, the first inclined surface IP1, the second inclined surface IP2, and a side surface S1 located between the first inclined surface IP1 and the second inclined surface IP2. The first inclined surface IP1, the second inclined surface IP2, and the side surface S1 may be formed by irradiating the laser and then spraying an etchant as described below. The first inclined surface IP1 and the second inclined surface IP2 may overlap each other in the third direction (Z-axis direction).

A first angle θ1 formed between the upper surface TTS of the first sub-substrate SSU1 and the first inclined surface IP1, a second angle θ2 formed between the first inclined surface IP1 and the side surface S1, a third angle θ3 formed between the side surface S1 and the second inclined surface IP2, and a fourth angle θ4 formed between the second inclined surface IP2 and the bottom surface BBS of the first sub-substrate SSU1 may be obtuse angles, respectively. The second angle θ2 between the first inclined surface IP1 and the side surface S1 may be greater than the first angle θ1 formed between the upper surface TTS of the first sub-substrate SSU1 and the first inclined surface IP1. The third angle θ3 formed between the side surface S1 and the second inclined surface IP2 may be greater than the fourth angle θ4 formed between the second inclined surface IP2 and the bottom surface BBS of the first sub-substrate SSU1.

In addition, the length of the first inclined surface IP1 may be the same as the length of the second inclined surface IP2. The length of the first inclined surface IP1 may be defined as the minimum distance from the edge where the first inclined surface IP1 and the side surface S1 are in contact each other to the edge where the first inclined surface IP1 and the upper surface TTS of the first sub-substrate SSU1 are in contact each other. Also, the length of the second inclined surface IP2 may be defined as the minimum distance from the edge where the second inclined surface IP2 and the side surface S1 are in contact to the edge where the second inclined surface IP2 and the bottom surface BBS of the first sub-substrate SSU1 are in contact. However, the present disclosure is not limited thereto, and the length of the first inclined surface IP1 may be greater or smaller than the length of the second inclined surface IP2.

In addition, the thickness of the first inclined surface IP1 may be the same as the thickness of the second inclined surface IP2. The thickness of the first inclined surface IP1 may be defined as a portion of the length of the first inclined surface IP1 in the third direction (Z-axis direction), and the thickness of the second inclined surface IP2 may be defined as a portion of the length of the second inclined surface IP2 in a third direction (Z-axis direction). However, the present disclosure is not limited thereto, and the thickness of the first inclined surface IP1 may be greater or smaller than the thickness of the second inclined surface IP2.

In one or more embodiments, the edge surfaces of the first sub-substrate SSU1 and the second sub-substrate SSU2 may have a substantially C-cut shape. For example, the first angle θ1 formed between the upper surface TTS of the first sub-substrate SSU1 and the first inclined surface IP1, the second angle θ2 formed between the first inclined surface IP1 and the side surface S1, the third angle θ3 formed between the side surface S1 and the second inclined surface IP2, and the fourth angle θ4 formed between the second inclined surface IP2 and the bottom surface BBS of the first sub-substrate SSU1 may be obtuse angles, respectively. Accordingly, it may be possible to reduce or prevent damage to the first sub-substrate SSU1 due to a physical impact, because the otherwise sharp part on the edge surface of the first sub-substrate SSU1 has a relaxed shape. That is, the impact resistance of the edge surfaces of the first sub-substrate SSU1 and the second sub-substrate SSU2 may be improved.

Figure 9:
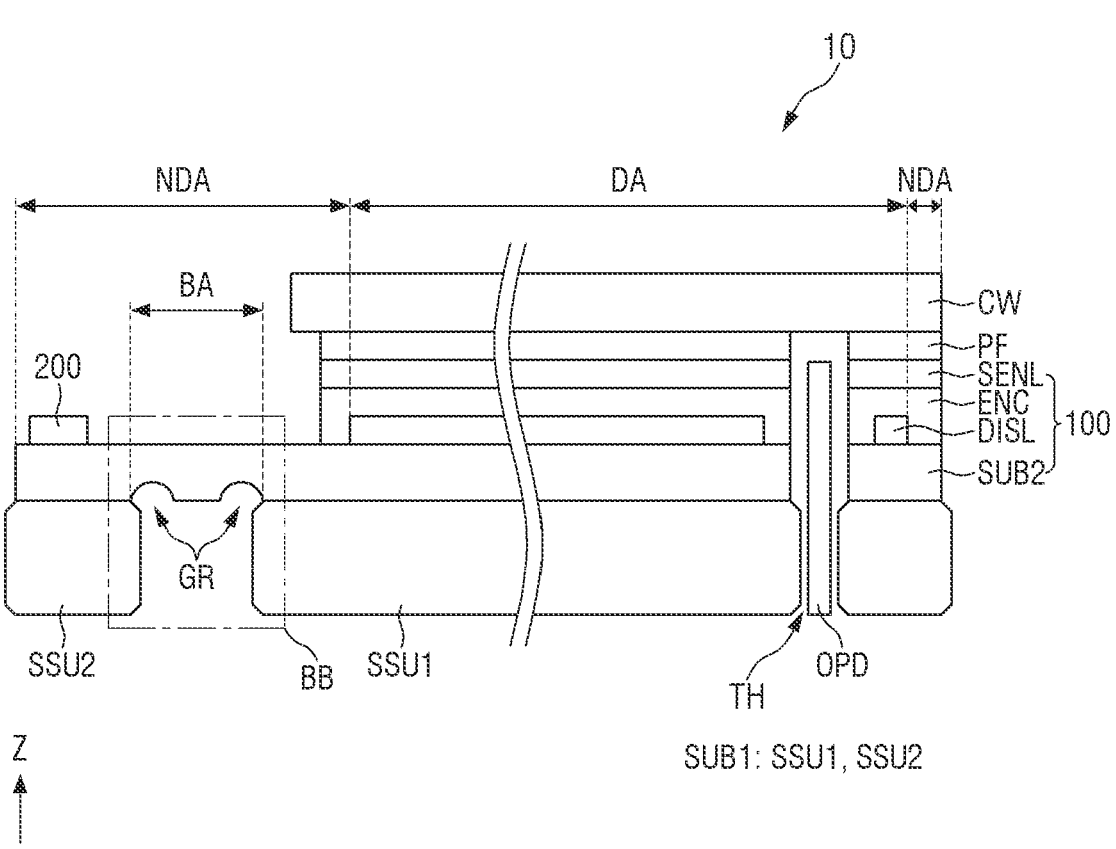
FIG. 9 is a cross-sectional view illustrating a display device according to one or more other embodiments.
Figure 10:
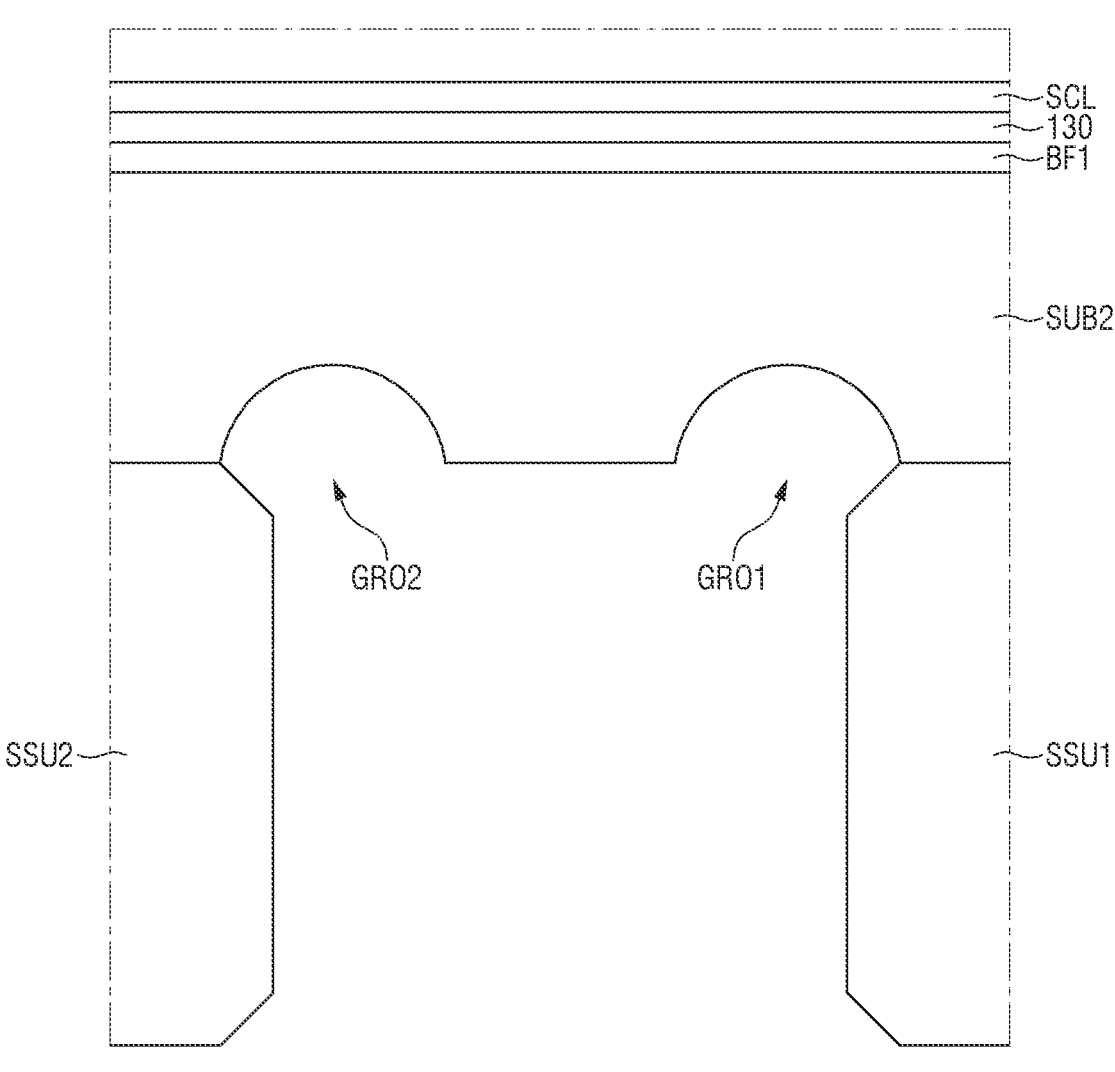
FIG. 10 is an enlarged view of an area BB of FIG. 9.

FIG. 9 is a cross-sectional view illustrating a display device according to one or more other embodiments. FIG. 10 is an enlarged view of an area BB of FIG. 9.

Referring to FIGS. 9 and 10, the presently described one or more embodiments are different from the above-described embodiments of FIGS. 5 to 8 in that a plurality of grooves are located on, or defined by, one surface of the second substrate SUB2. Hereinafter, a description of a configuration overlapping with the one or more embodiments corresponding to FIGS. 5 to 8 will be omitted or simplified, and differences will be described.

The display device 10 according to one or more embodiments may include a plurality of grooves GR located on, or defined by, one surface of the second substrate SUB2.

The plurality of grooves GR may be located on, or defined by, one surface of the second substrate SUB2. The plurality of grooves GR may overlap the bending area BA of the display device 10 and may be spaced apart from each other. However, the present disclosure is not limited thereto, and the plurality of grooves GR may contact each other.

The plurality of grooves GR may include a first groove GRO1 and a second groove GRO2. The first groove GRO1 may overlap the first sub-substrate SSU1 in the third direction (Z-axis direction), and the second groove GRO2 may be spaced apart from the first groove GRO1 and may overlap the second sub-substrate SSU2 in the third direction (Z-axis direction).

The first groove GRO1 and the second groove GRO2 may be formed in a groove shape concave in the third direction (Z-axis direction) from one surface of the second substrate SUB2. The first groove GRO1 and the second groove GRO2 may have a concave shape to have the curvature (e.g., predetermined curvature). For example, the first groove GRO1 and the second groove GRO2 may have a semicircular cross-section and extend along the bending area BA. In this case, the first groove GRO1 and the second groove GRO2 may be formed linearly along the bending area BA on, or defined by, one surface of the second substrate SUB2. Also, the first groove GRO1 and the second groove GRO2 may have a concave hemispherical shape. In this case, the first groove GRO1 and the second groove GRO2 may be spaced apart from each other, or in contact with each other, in a dot shape along the bending area BA on, or at, one surface of the second substrate SUB2.

The above-described first and second grooves GRO1 and GRO2 may be formed by removing the organic pattern OMP and the reflective layer RFL of the embodiments of FIGS. 5 to 8.

Figure 11:
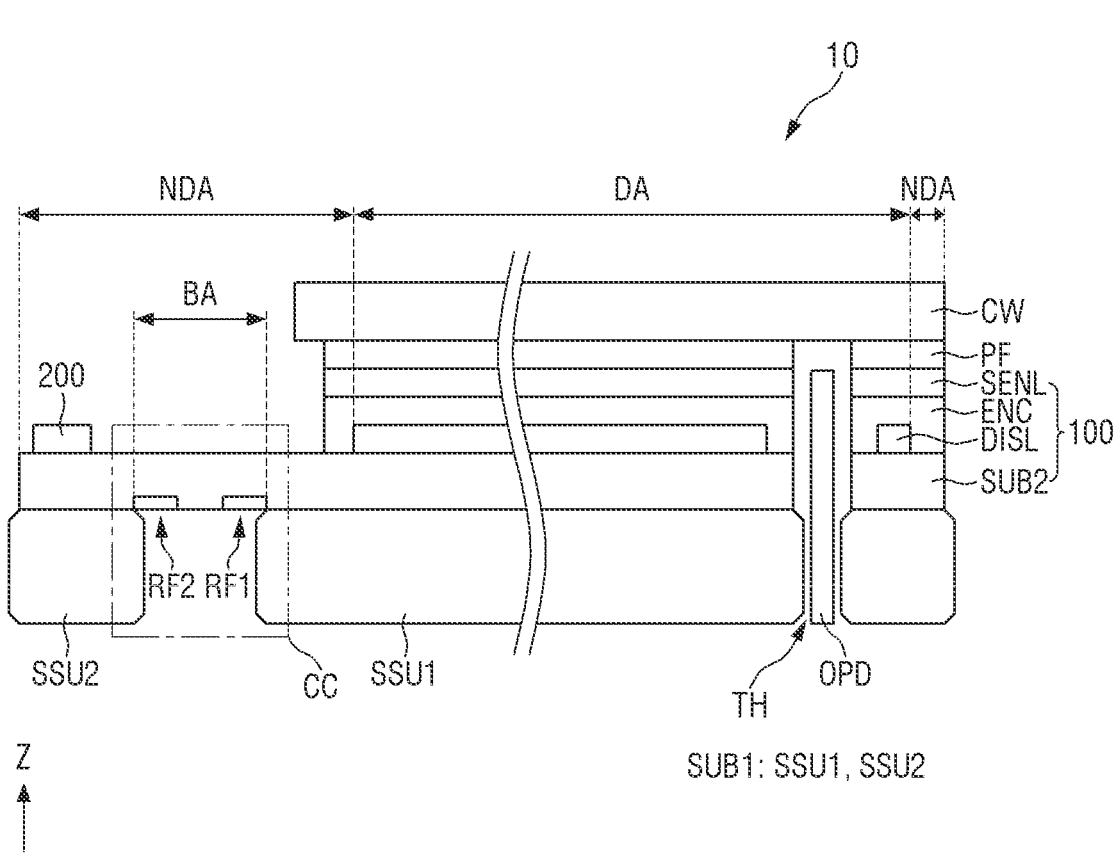
FIG. 11 is a cross-sectional view illustrating a display device according to one or more other embodiments.
Figure 12:
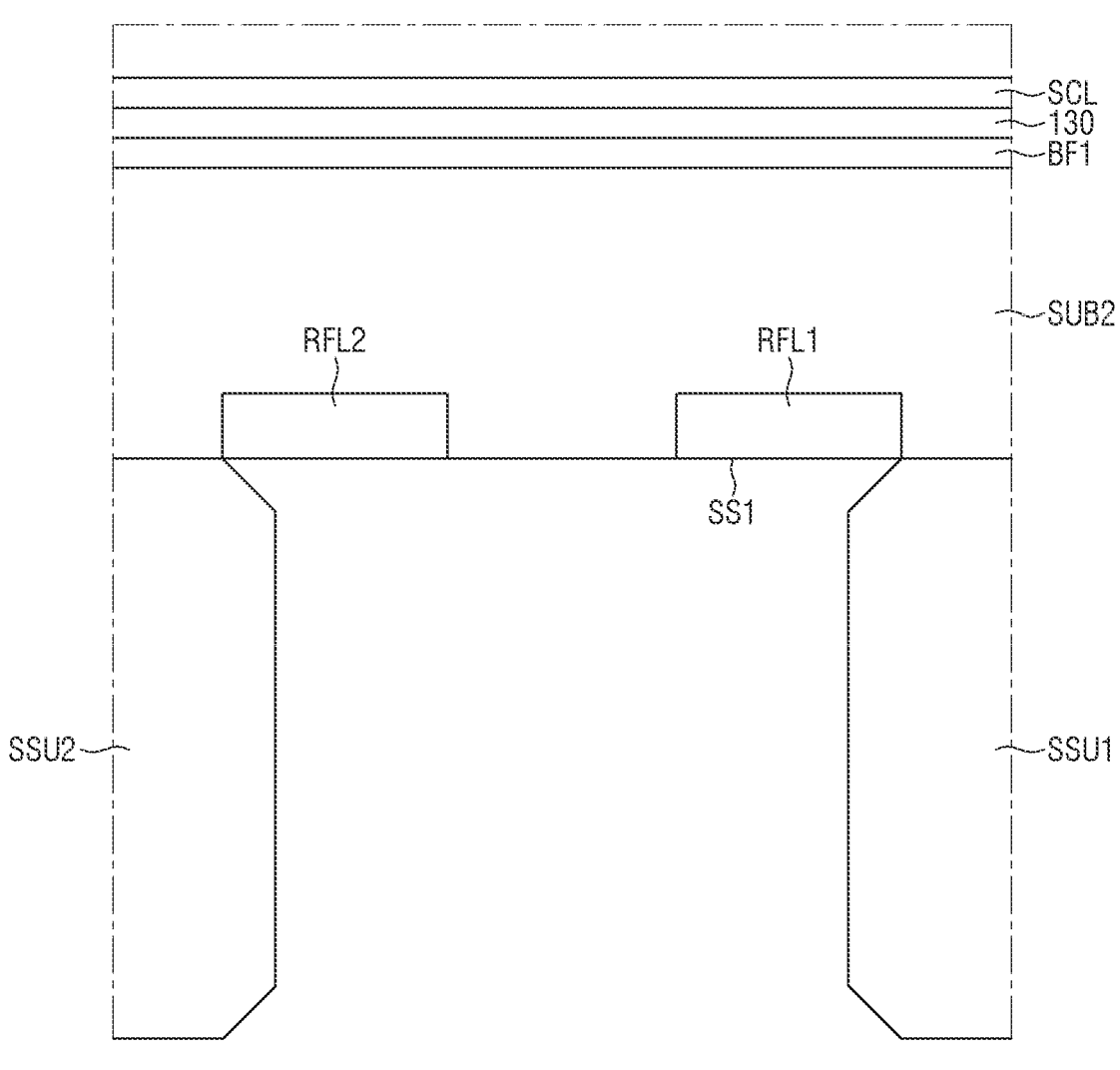
FIG. 12 is an enlarged view of the CC area of FIG. 11.

FIG. 11 is a cross-sectional view illustrating a display device according to one or more other embodiments. FIG. 12 is an enlarged view of the CC area of FIG. 11.

Referring to FIGS. 11 and 12, the presently described one or more embodiments are different from the above-described one or more embodiments corresponding to FIGS. 5 to 8 in that a plurality of flat reflective layers RFL1 and RFL2 are located on, or at, one surface of the second substrate SUB2. Hereinafter, the description of the configuration overlapping with the one or more embodiments corresponding to FIGS. 5 to 8 will be omitted or simplified, and differences will be described.

The plurality of reflective layers RFL1 and RFL2 may be located on, or at, one surface of the second substrate SUB2. The plurality of reflective layers RFL1 and RFL2 may overlap the bending area BA of the display device 10, and may be spaced apart from each other. However, the present disclosure is not limited thereto, and the plurality of reflective layers RFL1 and RFL2 may contact each other.

The plurality of reflective layers RFL1 and RFL2 may include the first reflective layer RFL1 and the second reflective layer RFL2. The first reflective layer RFL1 may overlap the first sub-substrate SSU1 in the third direction (Z-axis direction), and the second reflective layer RFL2 may be spaced apart from the first reflective structure RFS1 and may overlap the second sub-substrate SSU2 in the third direction (Z-axis direction).

The first reflective layer RFL1 and the second reflective layer RFL2 may be located on, or at, one surface of the second substrate SUB2. The first reflective layer RFL1 and the second reflective layer RFL2 may protrude from one surface of the second substrate SUB2 in the third direction (Z-axis direction). The first reflective layer RFL1 and the second reflective layer RFL2 may have a flat plate shape. For example, the first reflective layer RFL1 and the second reflective layer RFL2 may have a flat bar-like shape. In this case, the organic pattern OMP may be arranged in a linear or dot shape along the bending area BA on, or at, one surface of the second substrate SUB2.

The first reflective layer RFL1 and the second reflective layer RFL2 are made to be flat, so that the first surface SS1, which is the bottom surface of the first reflective layer RFL1 and of the second reflective layer RFL2, may be aligned with the bottom surface of the second substrate SUB2 to coincide with, or to be aligned with, each other. That is, the first surface SS1 of the first reflective layer RFL1 and the second reflective layer RFL2 may be flat. The first surface SS1 of the first reflective layer RFL1 and the second reflective layer RFL2 may reflect laser light, which will be described later.

The first reflective layer RFL1 and the second reflective layer RFL2 may include the metal material capable of reflecting light as in the above-described one or more embodiments corresponding to FIGS. 5 to 8. For example, the first reflective layer RFL1 and the second reflective layer RFL2 may be formed of a single layer, such as molybdenum (Mo), silver (Ag), copper (Cu), aluminum (Al), nickel (Ni), lanthanum (La), titanium (Ti), niobium (Nb), chromium (Cr), gold (Au), neodymium (Nd), platinum (Pt), tungsten (W), vanadium (V), iron (Fe), or a multilayer thereof. For example, the reflective layer RFL may include any one of molybdenum (Mo), aluminum (Al), and/or copper (Cu).

The above-described first reflective layer RFL1 and second reflective layer RFL2 may not only reflect laser light, which will be described later, but may also block the laser light from being irradiated to the signal line SCL. In the presently described one or more embodiments, it is possible to reduce or prevent damage to the signal lines SCL by reducing or preventing the laser light irradiated to the signal lines SCL.

Figure 13:
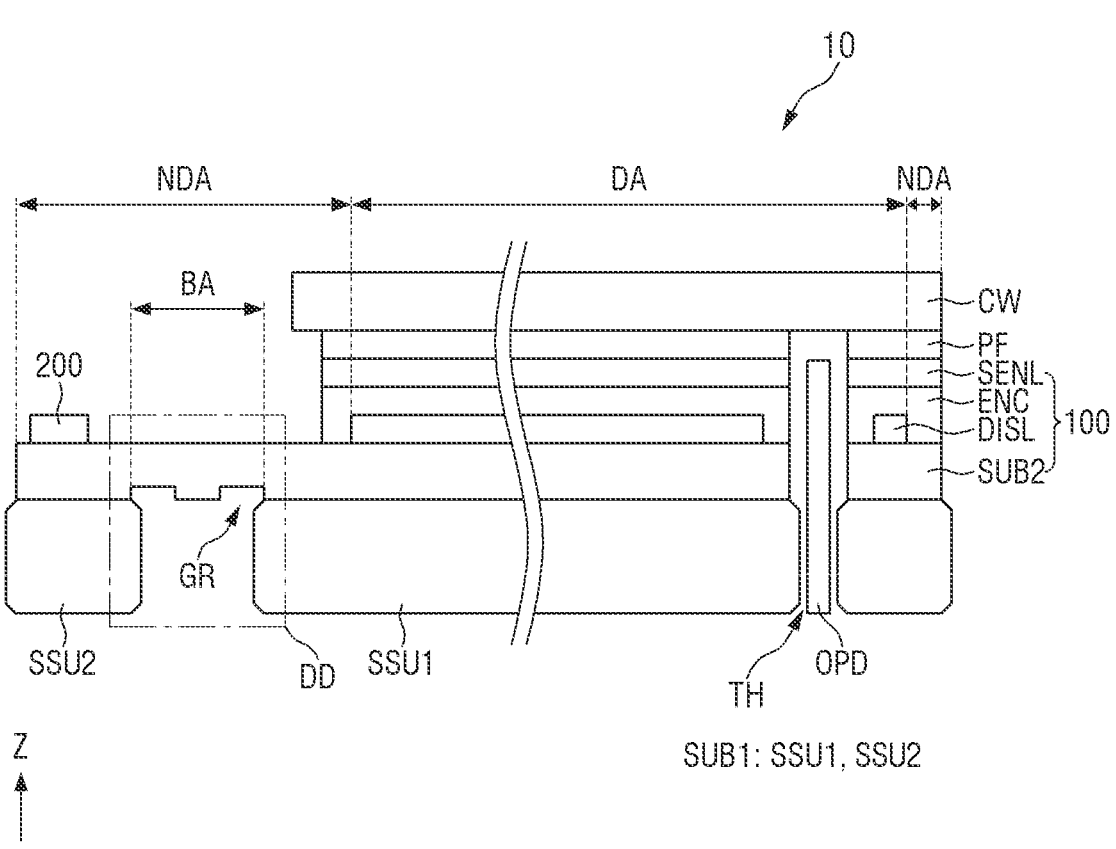
FIG. 13 is a cross-sectional view illustrating a display device according to one or more other embodiments.
Figure 14:
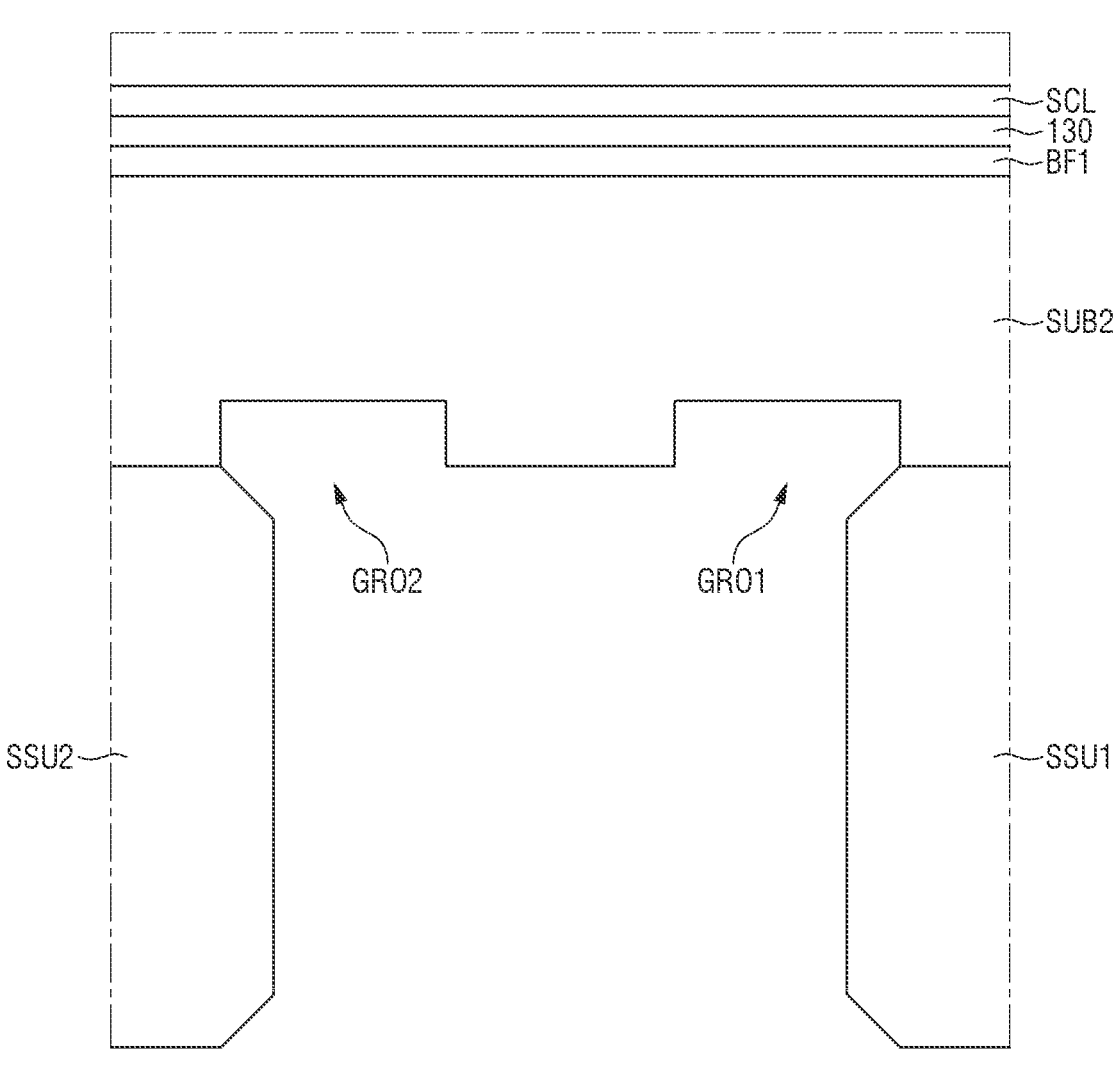
FIG. 14 is an enlarged view of the DD area of FIG. 13.

FIG. 13 is a cross-sectional view illustrating a display device according to one or more other embodiments. FIG. 14 is an enlarged view of the DD area of FIG. 13.

Referring to FIGS. 13 and 14, the presently described one or more embodiments are different from the above-described embodiments of FIGS. 11 and 12 in that the plurality of grooves are located on, or defined by, one surface of the second substrate SUB2. Hereinafter, the description of the configuration overlapping with the above-described embodiments of FIGS. 11 and 12 will be omitted or simplified, and differences will be described.

The display device 10 according to one or more embodiments may include the plurality of grooves GR located on, or defined by, one surface of the second substrate SUB2.

The plurality of grooves GR may be located on, or defined by, one surface of the second substrate SUB2. The plurality of grooves GR may overlap the bending area BA of the display device 10, and may be spaced apart from each other. However, the present disclosure is not limited thereto, and the plurality of grooves GR may contact each other.

The plurality of grooves GR may include the first groove GRO1 and the second groove GRO2. The first groove GRO1 and the second groove GRO2 may be formed in the groove shape to be concave in the third direction (Z-axis direction) from one surface of the second substrate SUB2. The first groove GRO1 and the second groove GRO2 may have the concave shape to have a flat surface. For example, the first groove GRO1 and the second groove GRO2 may have a rectangular cross-section and may have a shape extending along the bending area BA. In this case, the first groove GRO1 and the second groove GRO2 may be formed in the linear or dot shape along the bending area BA on, or defined by, one surface of the second substrate SUB2.

The above-described first and second grooves GRO1 and GRO2 may be formed by removing the first and second reflective layers RFL1 and RFL2 of the embodiments of FIGS. 11 and 12.

Hereinafter, a method of manufacturing the display device according to the above-described one or more embodiments will be described with reference to other drawings.

Figure 15:
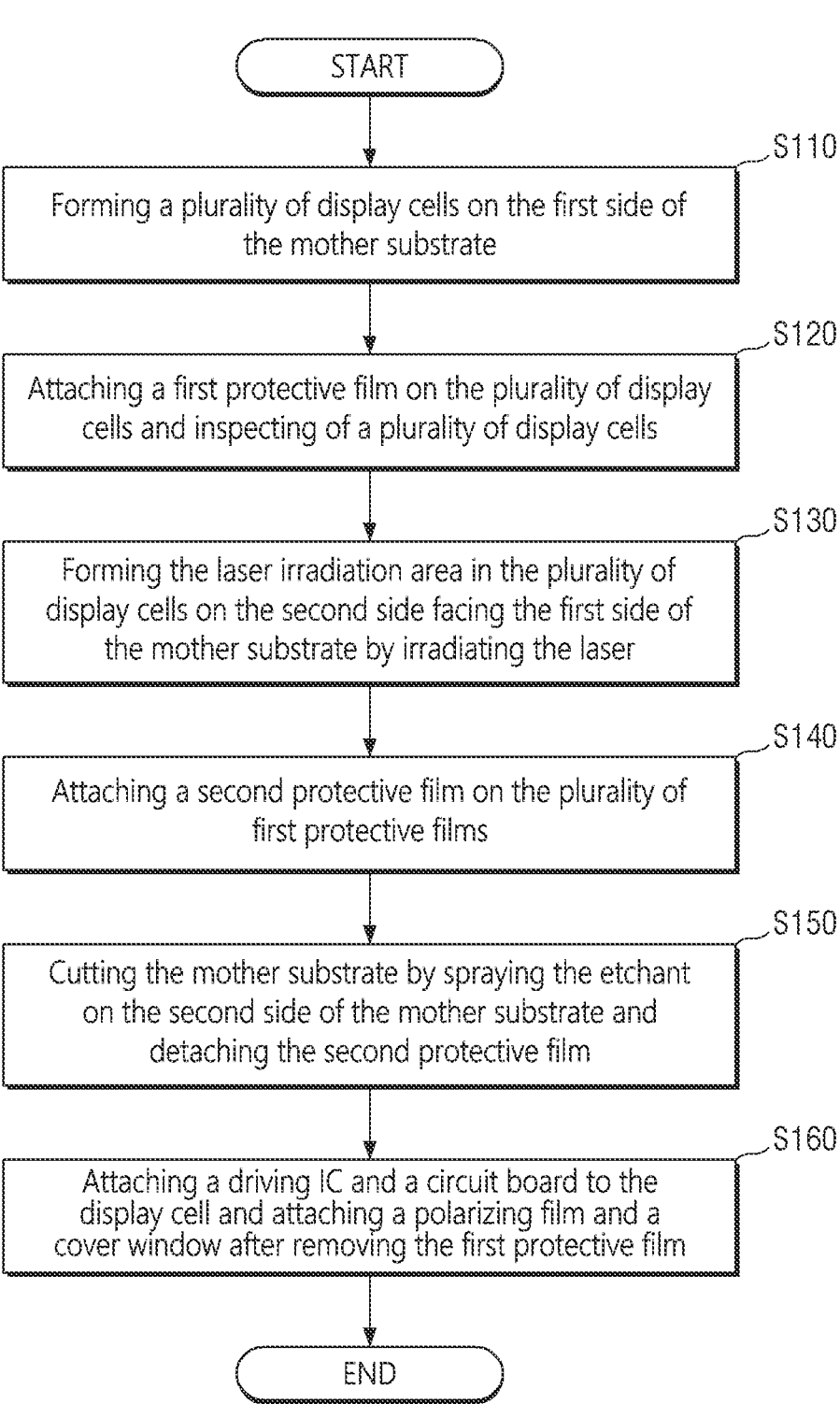
FIG. 15 is a flowchart illustrating a method of manufacturing a display device according to one or more embodiments.

FIG. 15 is a flowchart illustrating a method of manufacturing a display device according to one or more embodiments. FIGS. 16 to 30 are diagrams for explaining a method of manufacturing a display device according to one or more embodiments.

Figure 16:
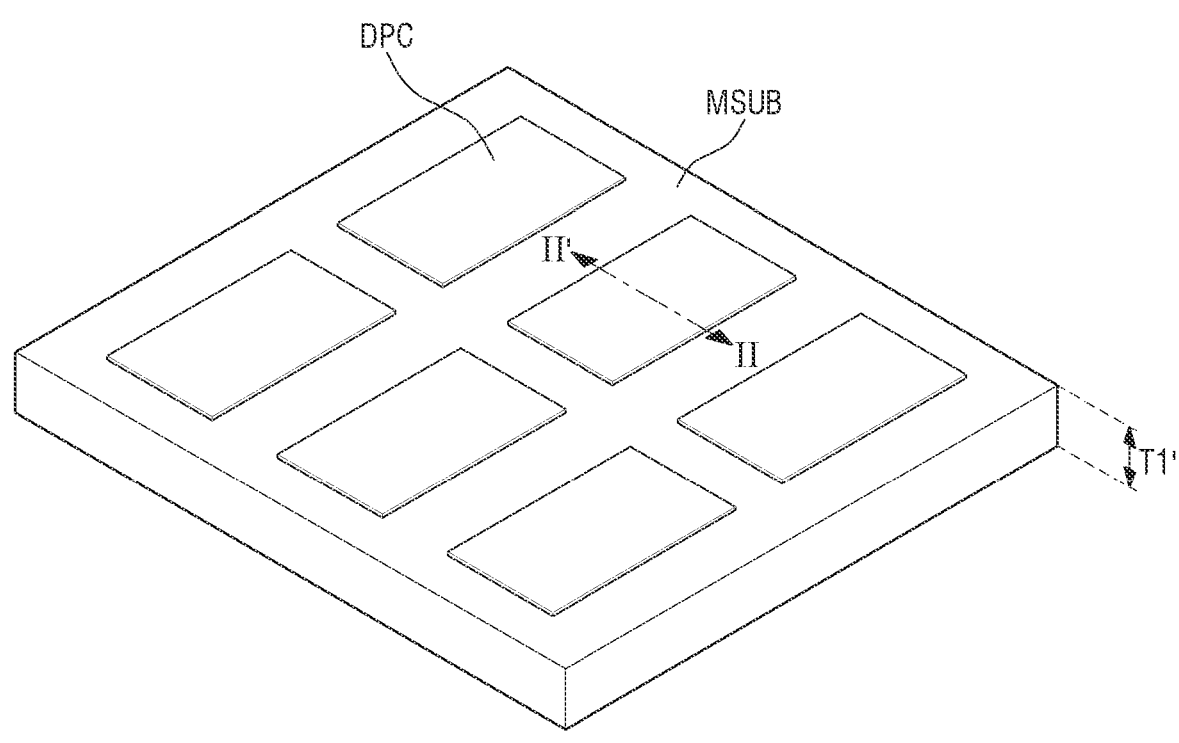
FIGS. 16 to 30 are diagrams for explaining a method of manufacturing a display device according to one or more embodiments.
Figure 17:
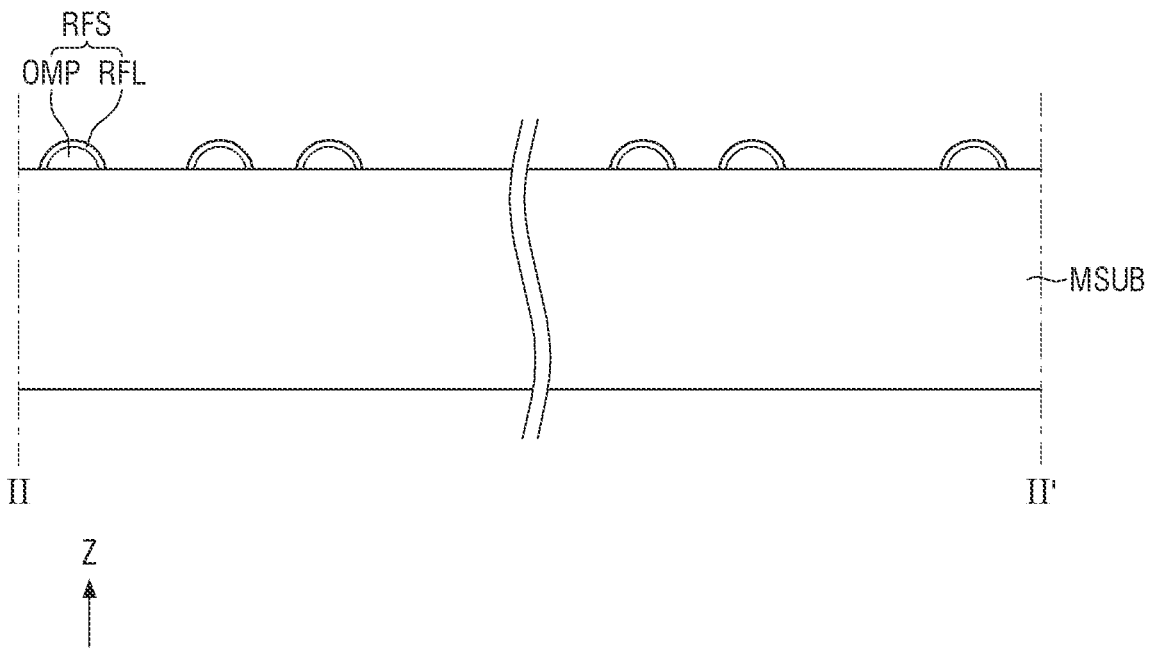
Figure 18:
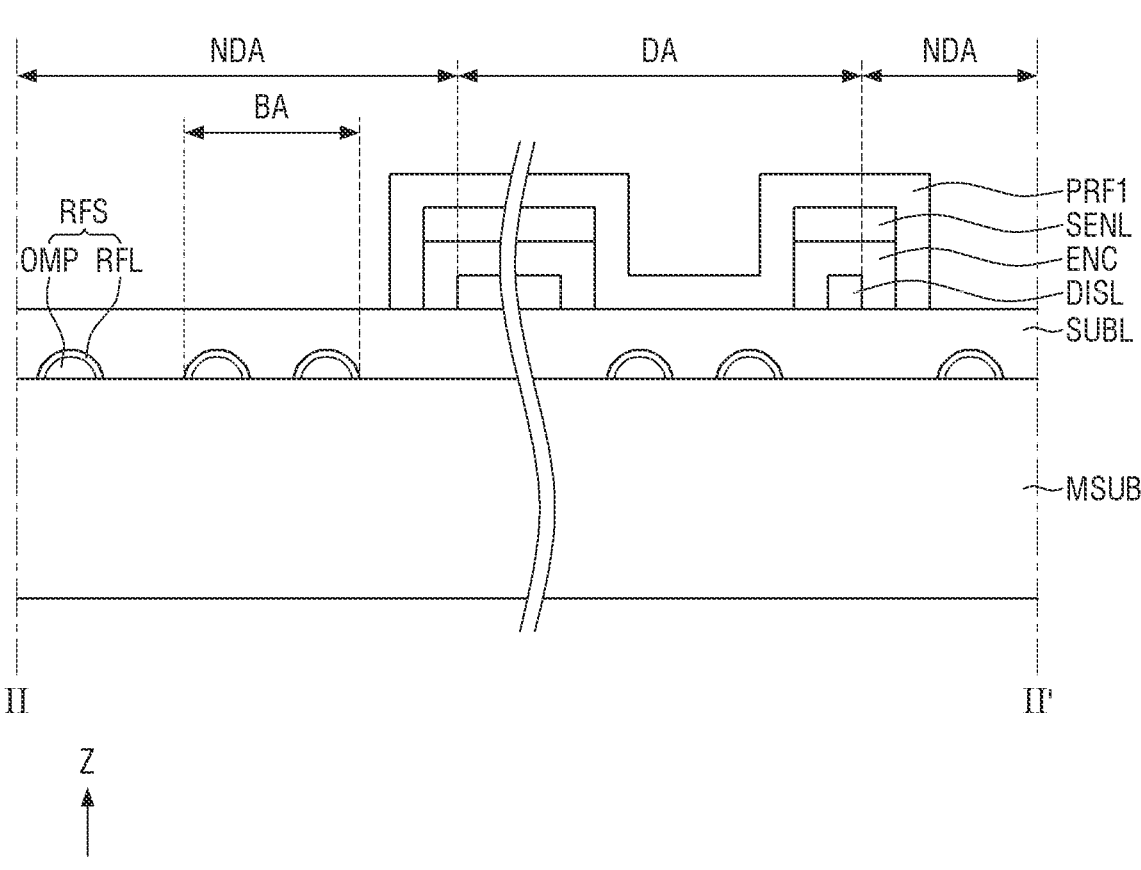
Figure 19:
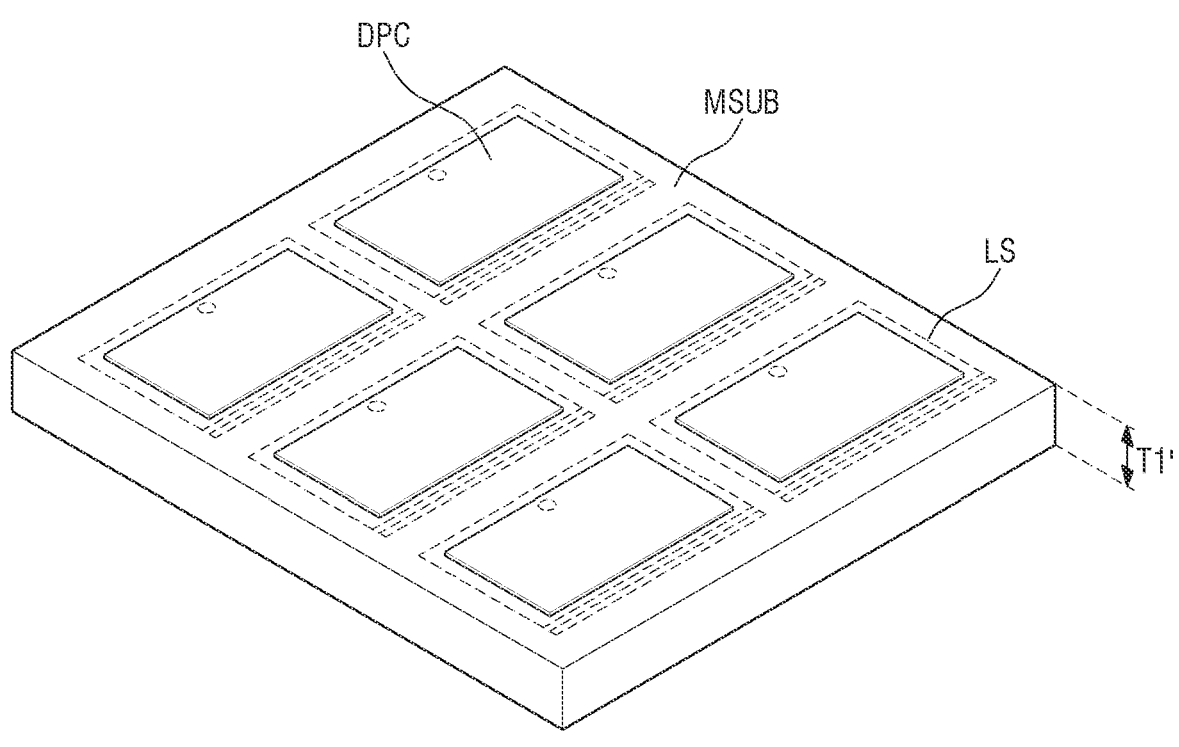
Figure 20:
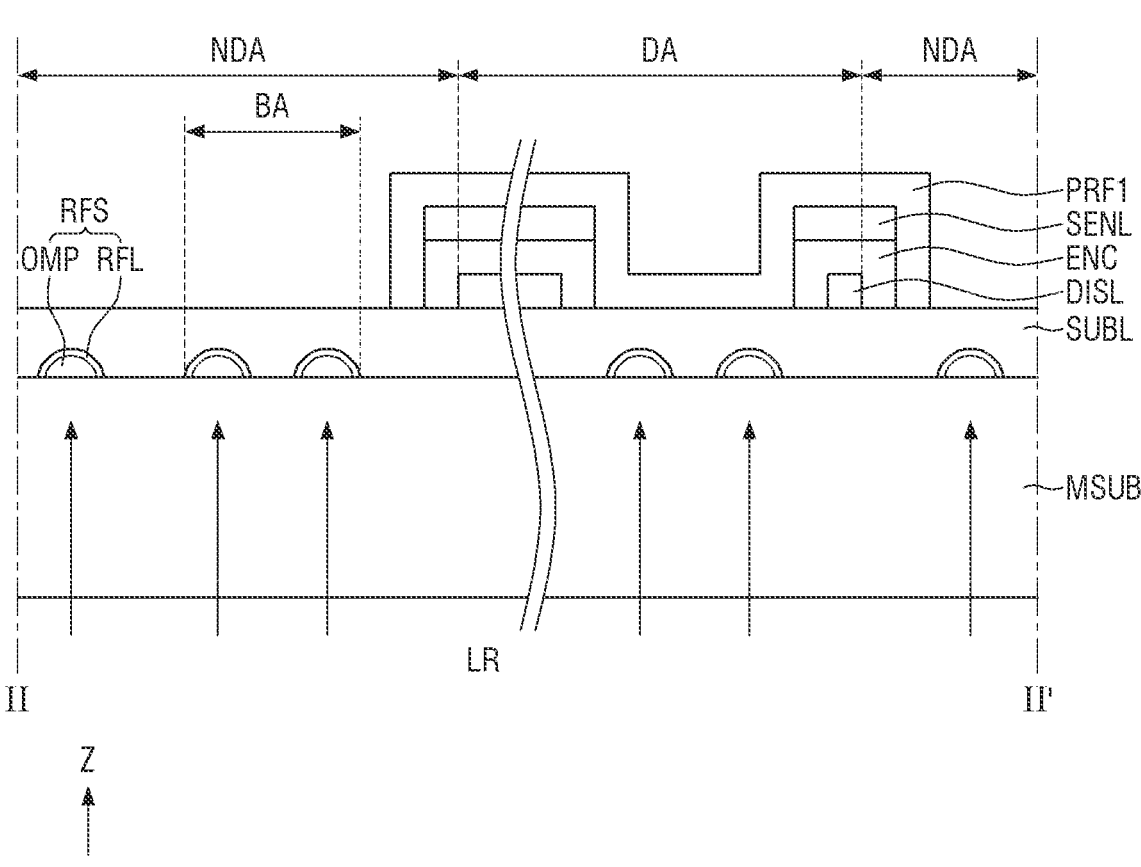
Figure 21:
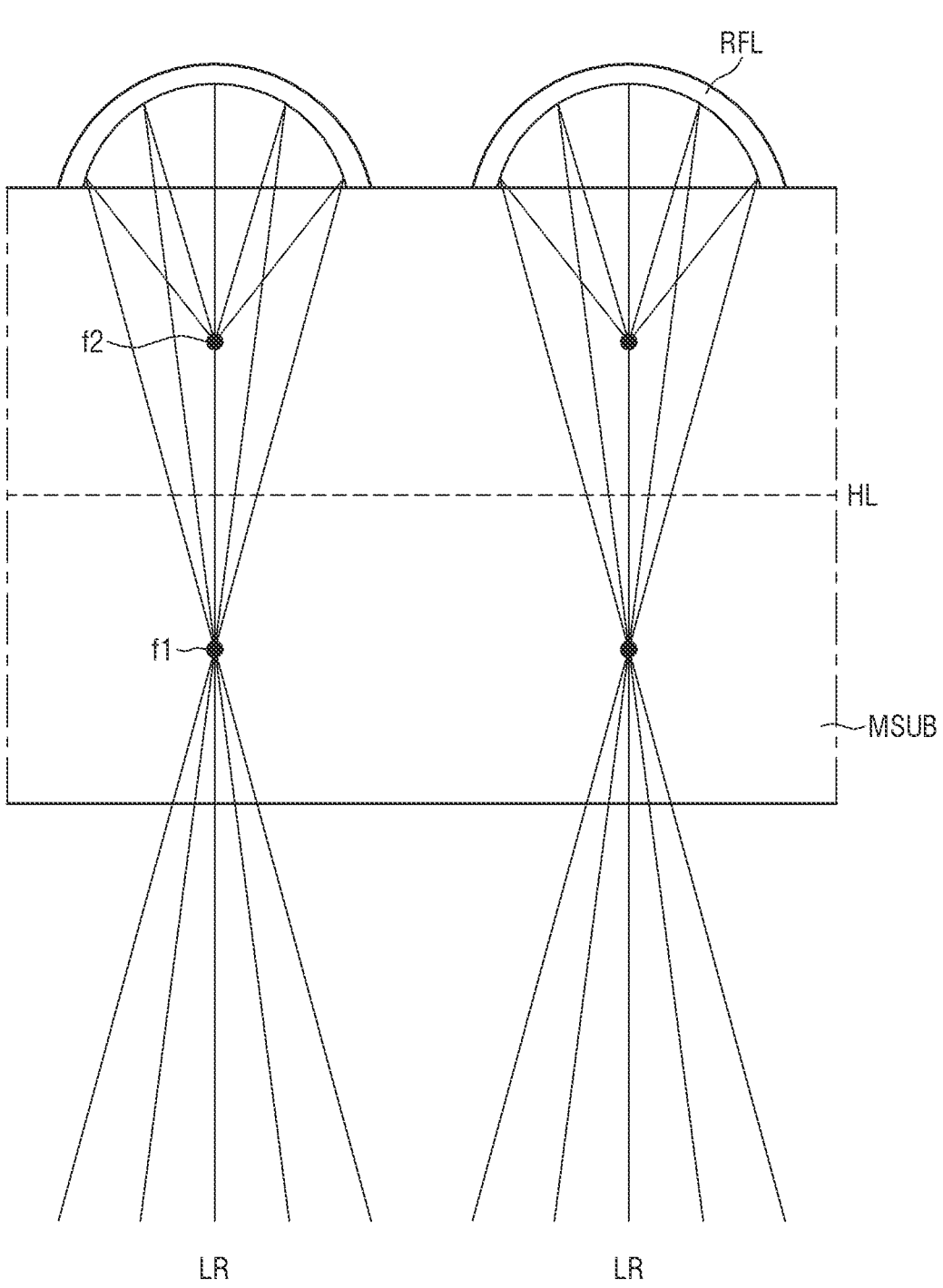
Figure 22:
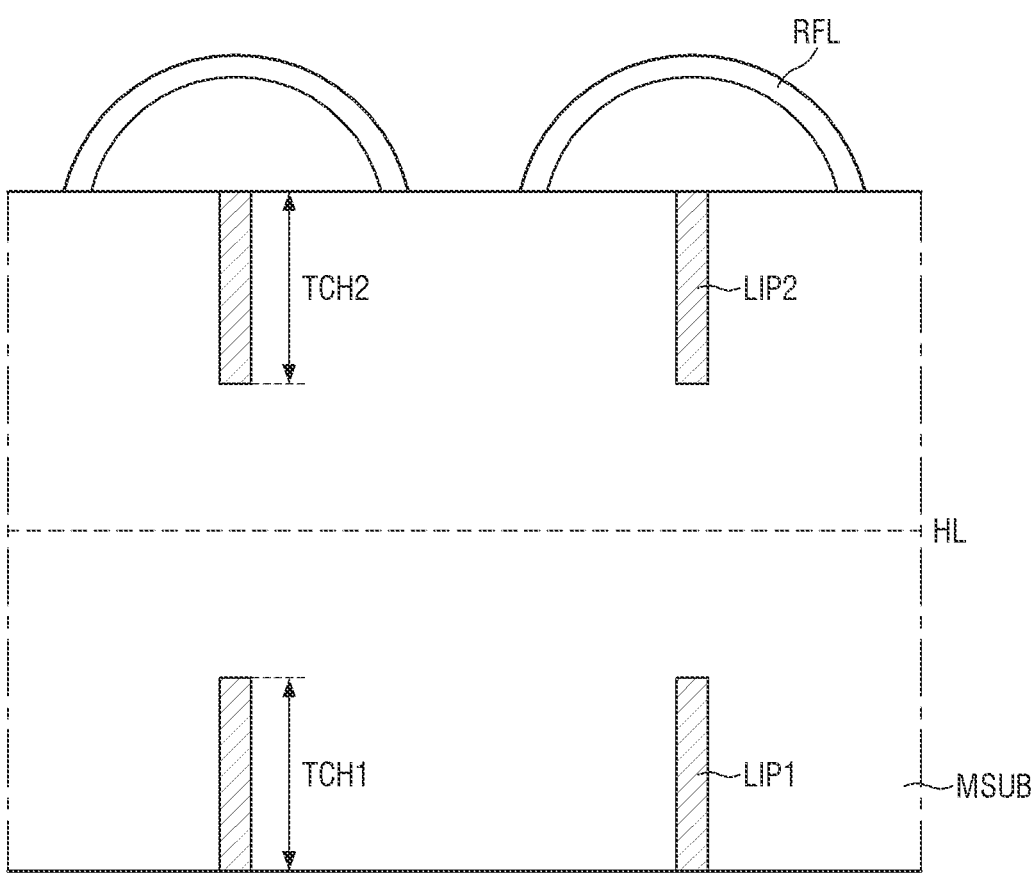

FIG. 16 is a perspective view of the mother substrate MSUB and a plurality of display cells DPC located on the mother substrate MSUB, and FIGS. 17 and 18 are cross-sectional views of the mother substrate MSUB and the plurality of display cells DPC cut along II-II' of FIG. 16. FIG. 19 is a perspective view of the mother substrate MSUB and the plurality of display cells DPC located on the mother substrate MSUB, and FIG. 20 is cross-sections of the mother substrate MSUB and the plurality of display cells DPC cut along II-II' of FIG. 16. FIGS. 21 and 22 show enlarged cross-sections of the bending area BA of the mother substrate MSUB.

First, the plurality of display cells DPC are formed on the first surface of the mother substrate MSUB (S110 in FIG. 15).

Next, a plurality of first protective films PRF1 are attached on the plurality of display cells DPC, and the plurality of display cells DPC is inspected (S120 in FIG. 15).

Referring to FIGS. 16 and 17, a plurality of reflective structures RFS are formed on the mother substrate MSUB. The organic material is coated on the mother substrate MSUB and a plurality of organic patterns OMP are formed using a mask process. In the mask process, organic patterns OMP are formed in the shape of a protrusion having the curved surface using a multi-tone mask.

Next, after laminating the metal material on the mother substrate MSUB on which the plurality of organic patterns OMP are formed, reflective layers RFL covering the plurality of organic patterns OMP are formed using the mask process. The reflective layers RFL may be formed in a concave mirror shape when viewed from the bottom side of the mother substrate MSUB by the organic pattern OMP. Accordingly, the plurality of reflective structures RFS including the organic pattern OMP and the reflective layer RFL may be formed.

Next, referring to FIG. 18, a sub-material layer SUBL is formed on the mother substrate MSUB on which the plurality of reflective structures RFS are formed. The sub-material layer SUBL may be formed using an organic material solution process, for example, inkjet, spin coating, slit coating, or the like. The sub-material layer SUBL may planarize the surface of the mother substrate MSUB on which the plurality of reflective structures RFS are formed.

Next, the display layer DISL, the encapsulating layer ENC, and the sensor electrode layer SENL are sequentially formed on the sub-material layer SUBL to form the plurality of display cells DPC. Next, a first protective film layer is attached to cover the mother substrate MSUB located between the plurality of display cells DPC. Then, the plurality of first protective films PRF1 may be respectively located on the plurality of display cells DPC by removing a portion of the first protective film layer located on the mother substrate MSUB. That is, a portion of the first protective film layer may be removed, and the remaining portions may be the plurality of first protective films PRF1. Therefore, the plurality of first protective films PRF1 may be respectively located on the plurality of display cells DPC. That is, the plurality of first protective films PRF1 may correspond to the plurality of display cells DPC on a one-to-one basis.

Each of the plurality of first protective films PRF1 may be a buffer film for protecting the plurality of display cells DPC from external impact. The plurality of first protective films PRF1 may be made of a transparent material.

Next, the plurality of display cells DPC are inspected using the inspection apparatus. After a probe is connected to a plurality of inspection pads provided in each of the plurality of display cells DPC, a lighting inspection of each of the plurality of display cells DPC may be performed.

When the lighting inspection is performed after the plurality of display cells DPC are separated from the mother substrate MSUB by the cutting process, an additional process for removing the plurality of inspection pads is required after the lighting inspection is completed. On the other hand, when the lighting inspection is performed on the mother substrate MSUB, the plurality of inspection pads are later removed when the plurality of display cells DPC are separated from the mother substrate MSUB by laser irradiation and etching. Therefore, when the lighting inspection is performed on the mother substrate MSUB, there is an advantage that a separate additional process for removing the plurality of inspection pads is not required.

Next, a laser irradiation area LIP is formed in the plurality of display cells DPC by irradiating the laser LR on the second surface facing the first surface of the mother substrate MSUB (S130 in FIG. 15).

As shown in FIG. 19, a cutting line LS may be sketched by irradiating the laser LR to form a plurality of laser irradiation areas LIP along edges and inside of the plurality of display cells DPC. The cutting line LS may be formed at edges and inside the plurality of display cells DPC. The cutting line LS formed in the display cell DPC may correspond to the bending area and the through hole of the display cell DPC.

Various lasers may be used as the laser LR according to one or more embodiments. For example, the laser LR may use a dotted line, a filament, an elongated spot, or a Bessel beam classified according to the shape of a beam. In the present specification, it is described that the laser LR is an infrared dot line having a wavelength of about 1030 nm.

As shown in FIG. 20, the laser LR may be irradiated on the second surface of the mother substrate MSUB. However, the embodiments of the present specification are not limited thereto. The laser LR may be irradiated on the first surface of the mother substrate MSUB. The laser LR may be irradiated toward the plurality of reflective structures RFS. That is, the area where the laser LR is sketched may overlap the plurality of reflective structures RFS in the third direction (Z-axis direction).

Referring to FIGS. 21 and 22, when the laser LR is irradiated onto the second surface of the mother substrate MSUB, the laser beams LR are irradiated to pass through a first focal point f1. The first focal point f1 may be located adjacent to the second surface of the mother substrate MSUB based on a horizontal line HL dividing the thickness in the third direction (Z-axis direction) of the mother substrate MSUB. The laser LR may be irradiated such that the first focal point f1 moves toward the second surface of the mother substrate MSUB when the laser LR is irradiated.

The laser beams LR passing through the first focal point f1 may pass through the mother substrate MSUB, and may be reflected from the reflective layer RFL of the reflective structure RFS. The laser beams LR are reflected by the reflective layer RFL acting as a concave mirror and pass through a second focal point f2. The second focal point f2 may be located adjacent to the first surface of the mother substrate MSUB based on the horizontal line HL. The laser LR may be irradiated such that the second focal point f2 moves toward the first surface of the mother substrate MSUB when the laser LR is irradiated.

The reflective layer RFL of the above-described reflective structure RFS may generate another focal point by reflecting the laser LR irradiated with a single focal point. That is, it is possible to implement a multifocal laser LR within the mother substrate MSUB.

As shown in FIG. 22, the laser LR irradiated to the mother substrate MSUB is irradiated while the first focal point f1 and the second focal point f2 are moved to adjacent surfaces, so that laser irradiation areas LIP1 and LIP2 may be formed in the mother substrate MSUB. The first laser irradiation area LIP1 is an area irradiated by moving the first focal point f1 of the laser LR, and a second laser irradiation area LIP2 may be an area irradiated by moving the second focal point f2 of the laser LR.

When the laser LR is irradiated to the mother substrate MSUB, which is a glass substrate, the selectivity ratio by the etching solution of the glass may be changed. For example, the first and second laser irradiation areas LIP1 and LIP2 may be etched faster by the etchant because a surface area in contact with the etchant increases compared to the area where the laser LR is not irradiated. In addition, in the first and second laser irradiation areas LIP1 and LIP2, a chemical structure that is etched faster by the etchant among chemical structures constituting the glass substrate, for example, $SiO_4$ increases, so that it may be etched faster by the etchant.

When the laser LR is irradiated on the second surface of the mother substrate MSUB, a depth (or sketch length) TCH1 of each of the laser irradiation areas LIP1 and LIP2 formed by the laser LR may be adjusted by adjusting a repetition rate, a processing speed, and/or a pulse energy. For example, the depths TCH1 and TCH2 of each of the plurality of laser irradiation areas LIP1 and LIP2 may be at least about 200 μm from the first or second surface of the mother substrate MSUB. However, the present disclosure is not limited thereto.

The laser LR for forming the laser irradiation areas LIP1 and LIP2 may be irradiated with the repetition rate of about 10 kHz to about 250 kHz, the processing speed of about 10 mm/s to about 250 mm/s, and the pulse energy of about 10 uJ to 300 about uJ. However, it may be suitable to irradiate with the repetition rate of about 17.5 kHz to about 125 kHz, the processing speed of about 17.5 mm/s to about 125 mm/s, and the pulse energy of about 25 uJ to about 178 uJ in order for the laser LR to have the depth of about 225 μm from the first or second surface of the mother substrate MSUB.

Next, a second protective film PRF2 is attached on the plurality of first protective films PRF1 (S140 in FIG. 15).

Figure 23:
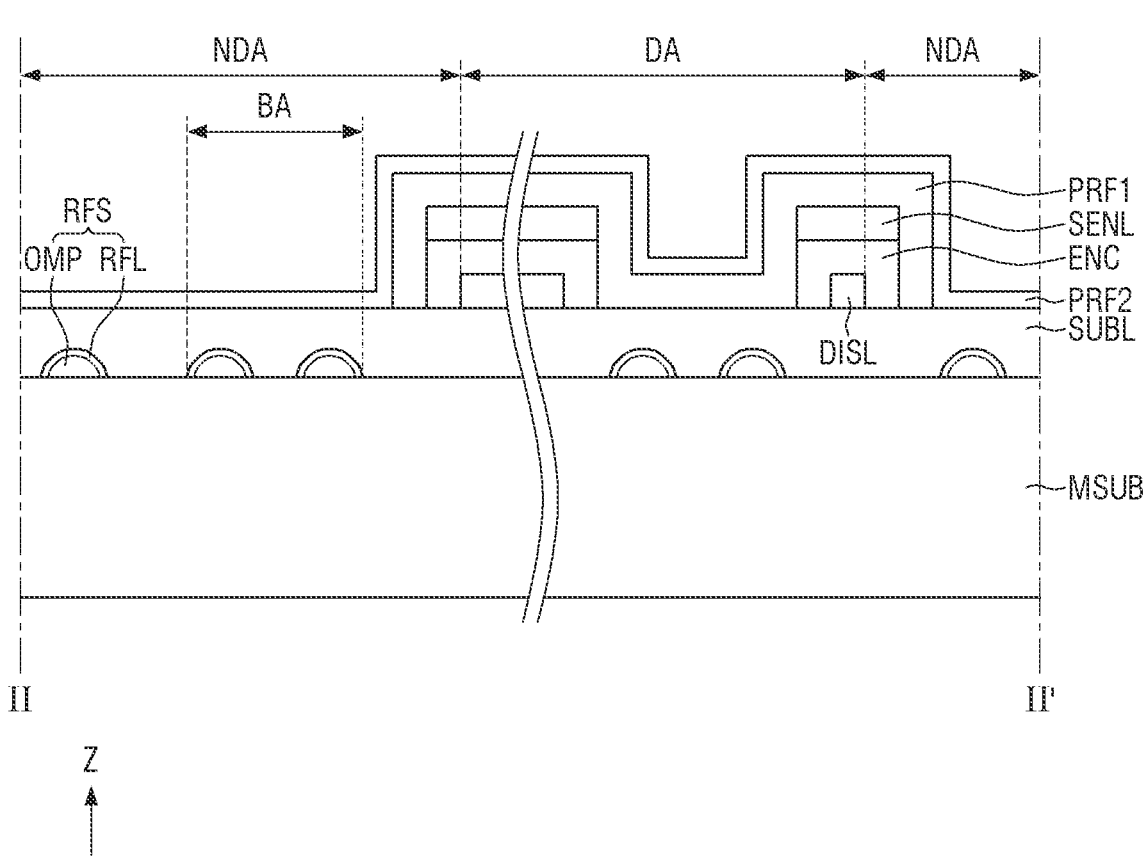
Figure 24:
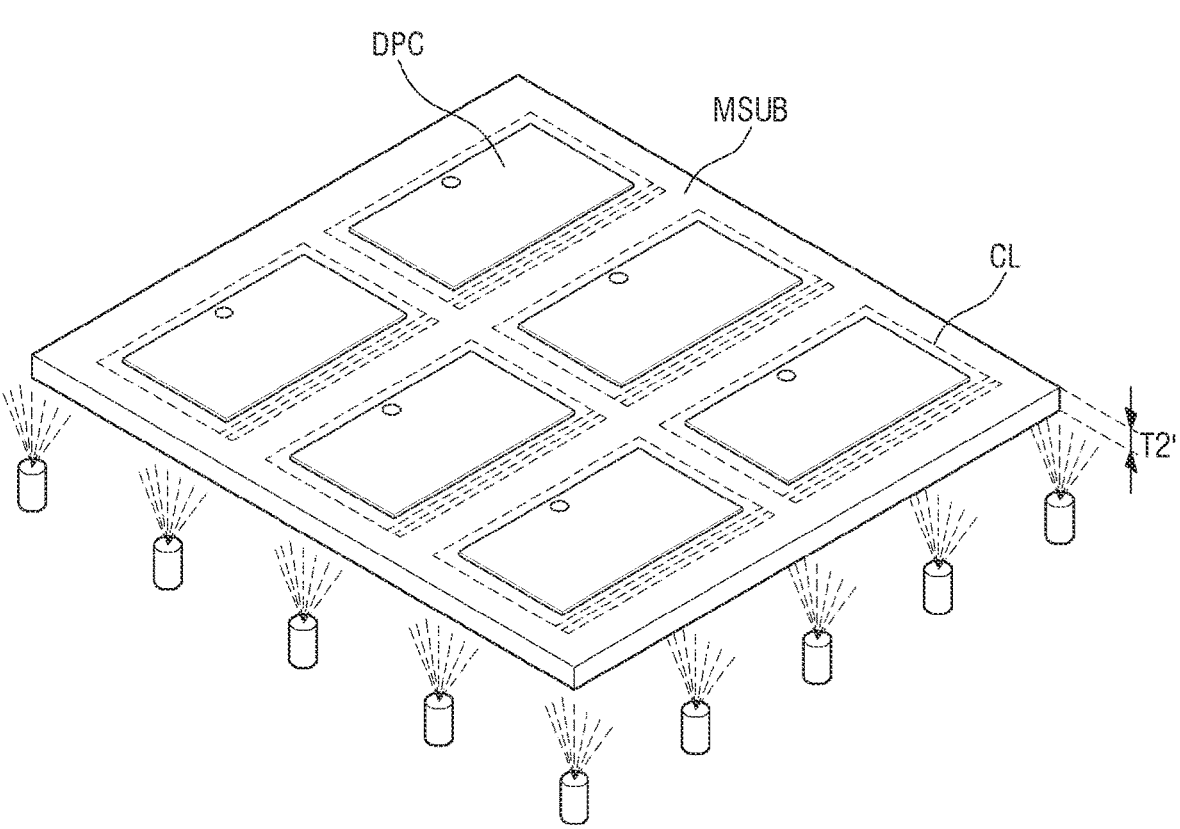
Figure 25:
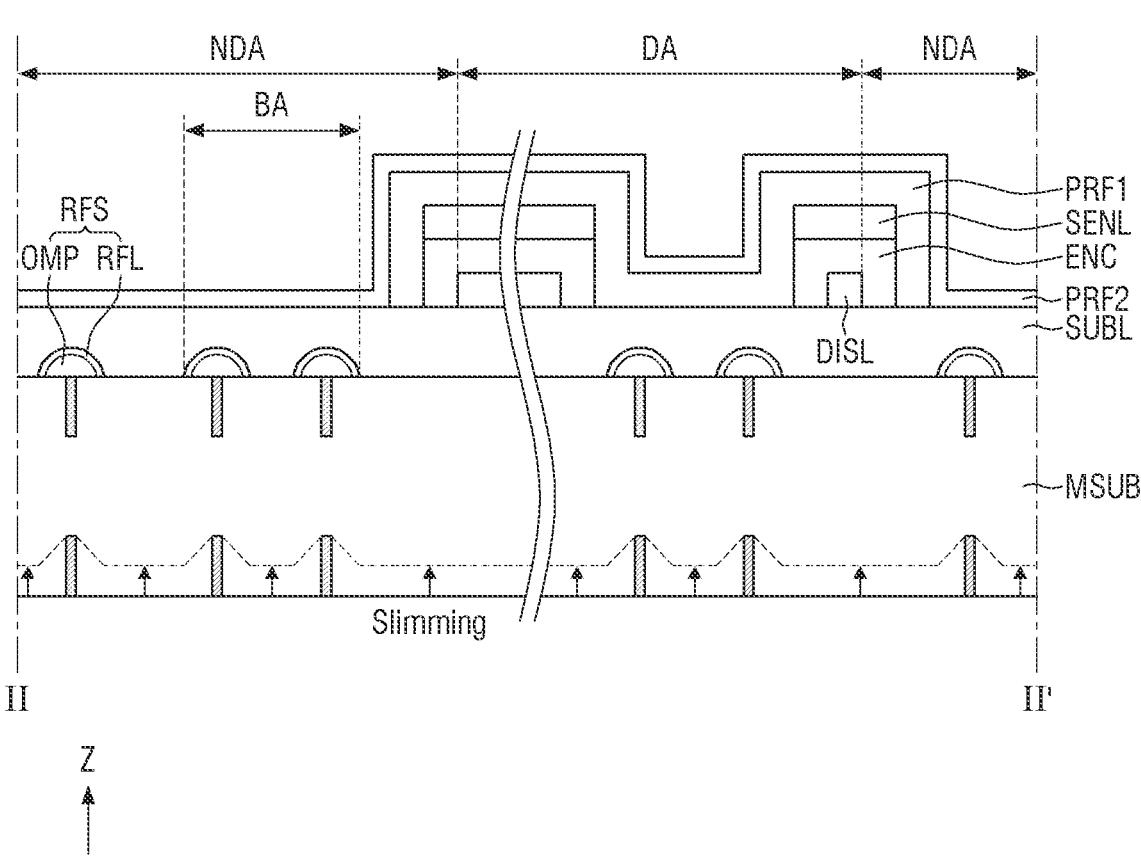
Figure 26:
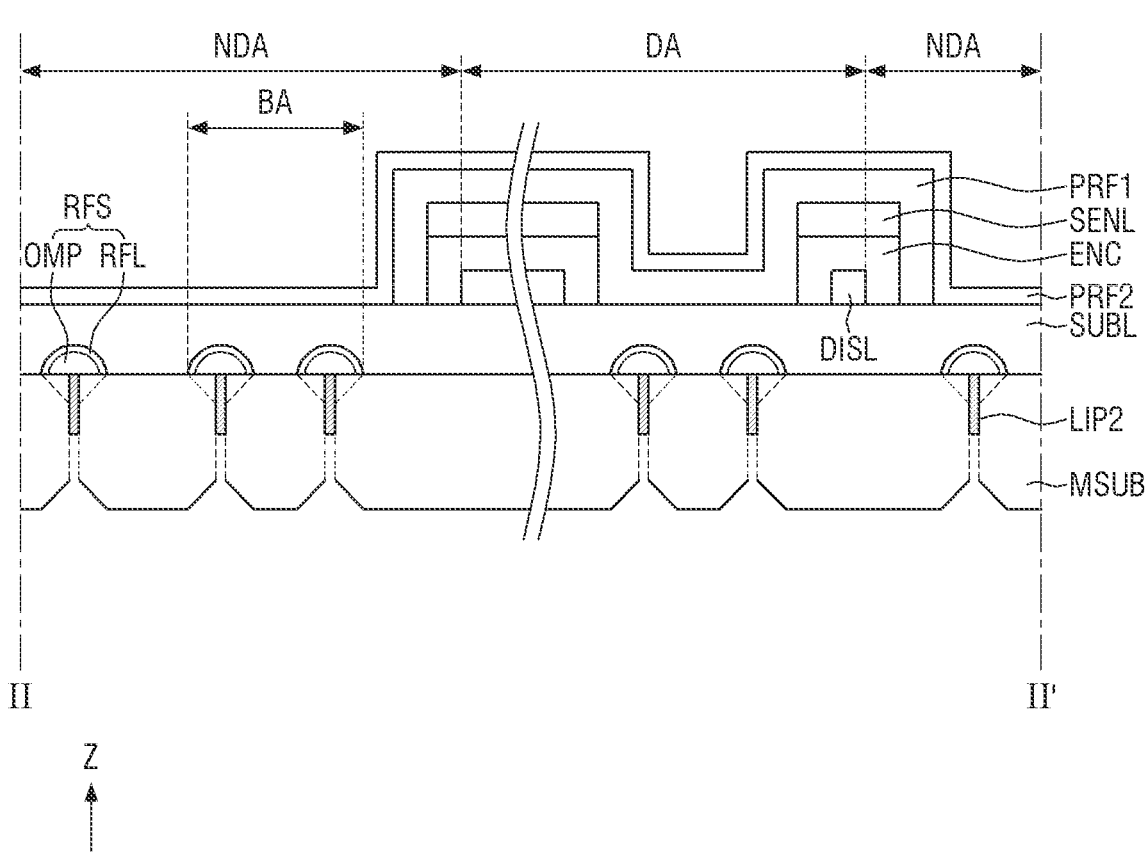

Referring to FIG. 23, the second protective film PRF2 may be attached to the first protective film PRF1 and a sub-material layer SUBL that is not covered by the first protective films PRF1 and is exposed. The second protective film PRF2 may be an acid-resistant film for protecting the plurality of display cells DPC from the etchant in the etching process of the mother substrate MSUB to be performed in the next step.

Next, the etchant is sprayed on the second surface of the mother substrate MSUB to reduce the thickness of the mother substrate MSUB, to cut the mother substrate, and to detach the second protective film PRF2 (S150 in FIG. 15).

Referring to FIGS. 24 to 29, when the etchant is sprayed on the second surface of the mother substrate MSUB, the mother substrate MSUB may be reduced from a first thickness (T1' in FIG. 19) to a second thickness T2'. Because the mother substrate MSUB is etched without the separate mask, isotropic etching in which all areas of the second surface of the mother substrate MSUB are uniformly etched up to the area in which the first laser irradiation areas LIP1 are formed may be performed.

When the etchant reaches the plurality of first laser irradiation areas LIP1 formed by the laser LR, a difference in etching rate may occur in an area in which the plurality of first laser irradiation areas LIP1 are formed, and in an area in which the plurality of first laser irradiation areas LIP1 are not formed, due to the plurality of first laser irradiation areas LIP1. That is, the mother substrate MSUB is anisotropically etched, in which the etching rate in the area in which the plurality of first laser irradiation areas LIP1 is formed is faster than the etching rate in the area in which the plurality of first laser irradiation areas LIP1 are not formed.

In addition, when the etchant reaches the plurality of second laser irradiation areas LIP2 formed by the laser LR, a difference in etching rate may occur in an area in which the plurality of second laser irradiation areas LIP2 are formed and in an area in which the plurality of second laser irradiation areas LIP2 are not formed.

Figure 27:
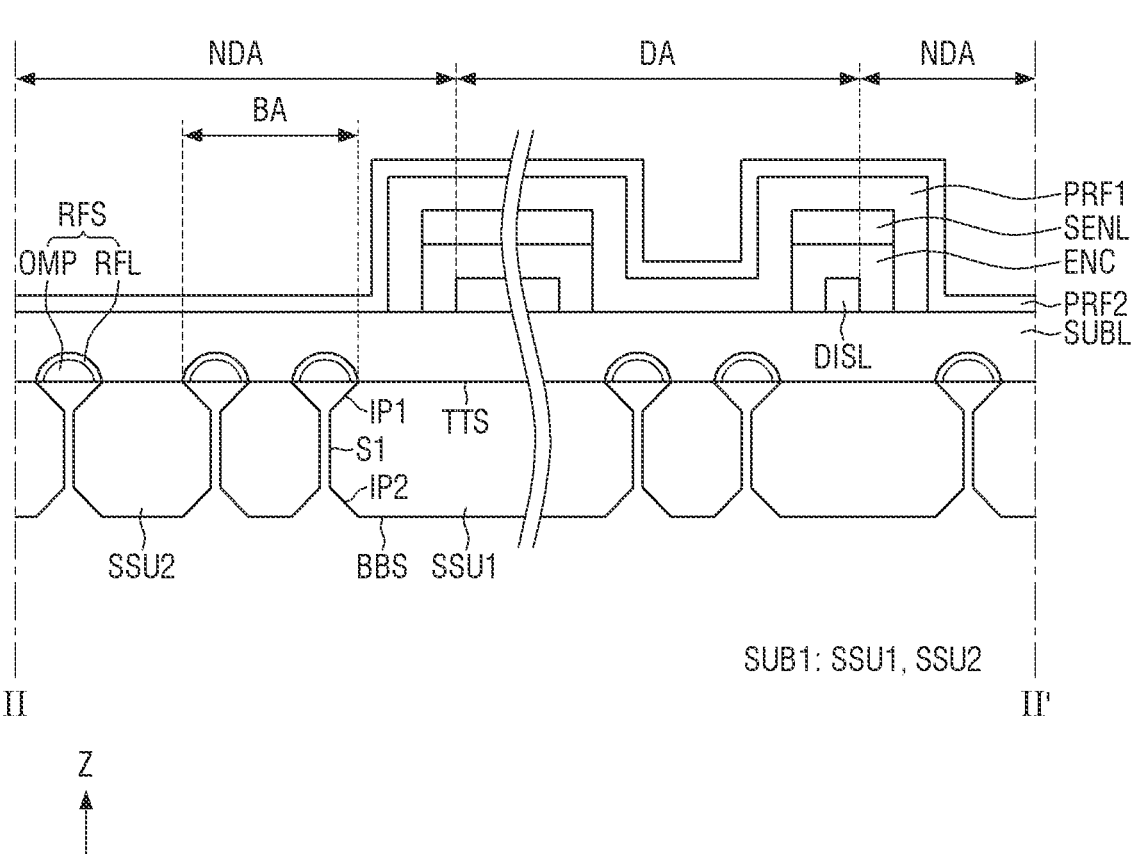
Figure 28:
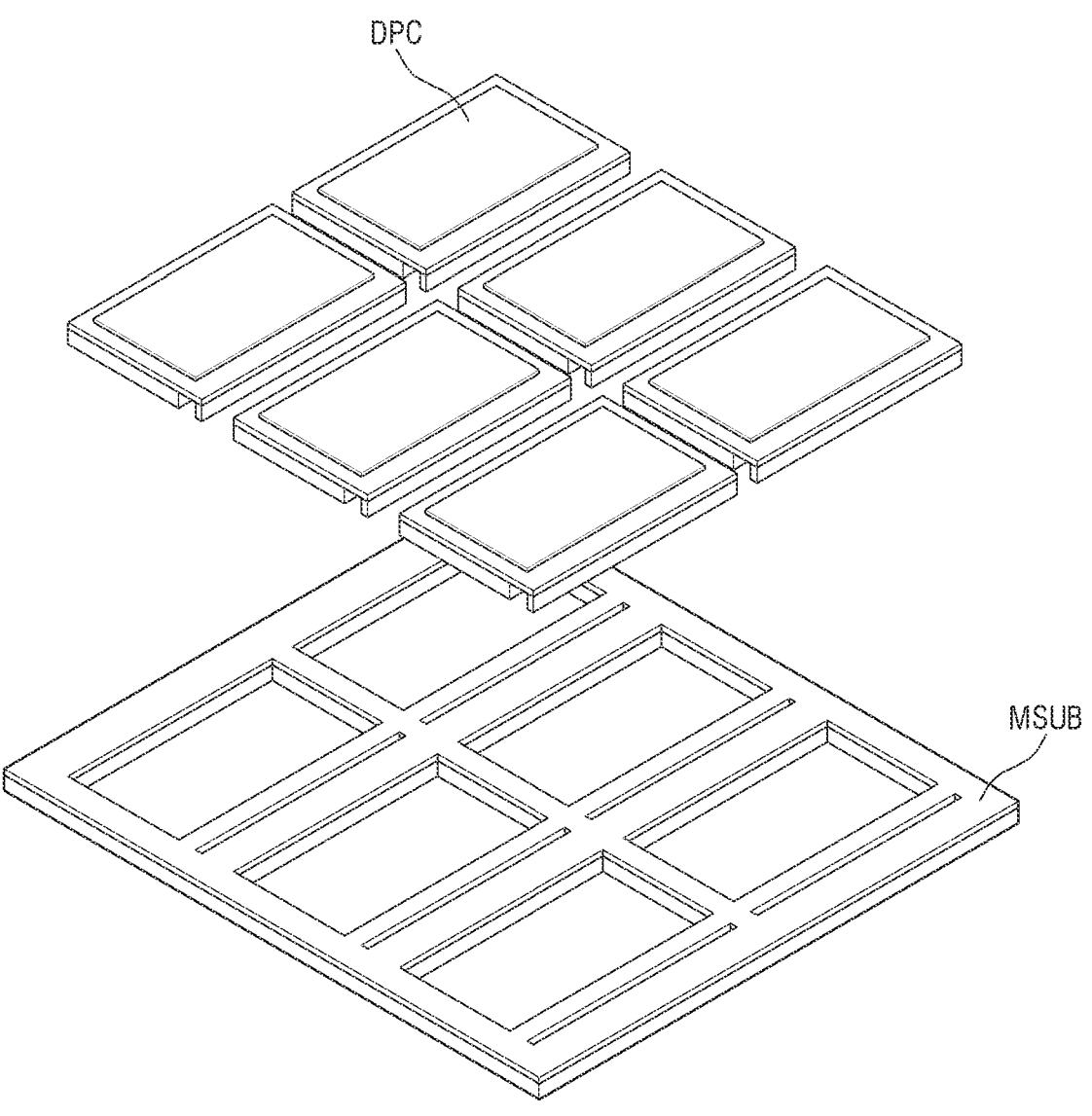

Accordingly, as shown in FIGS. 27 and 28, the first substrate SUB1 separated from the mother substrate MSUB may be included the first inclined surface IP1 located between the side surface S1 and the upper surface TTS, and the second inclined surface IP2 located between the side surface S1 and the bottom surface BBS.

In addition, as the etchant penetrates into the plurality of laser irradiation areas LIP1 and LIP2 formed by the laser LR, the mother substrate MUSB may be separated along a cutting line CL. That is, each of the plurality of display cells DPC may be separated from the mother substrate MSUB.

The first surface of the mother substrate MSUB is not penetrated by the etchant by the second protective film, whereas the second surface of the mother substrate MSUB is etched by the etchant, so differences may occur between the first surface and the second surface of the mother substrate MSUB in roughness, hardness, light transmittance, light reflectance, local density, surface chemical structure, and the like.

Next, the sub-material layer SUBL located in the remaining area except for the bending area BA of the display cell DPC, for example, in the area corresponding to the edge of the display cell DPC and the through hole. In this case, the plurality of reflective structures RFS located in the area where the sub-material layer SUBL is removed may be lifted off and removed as the sub-material layer SUBL is removed.

Figure 29:
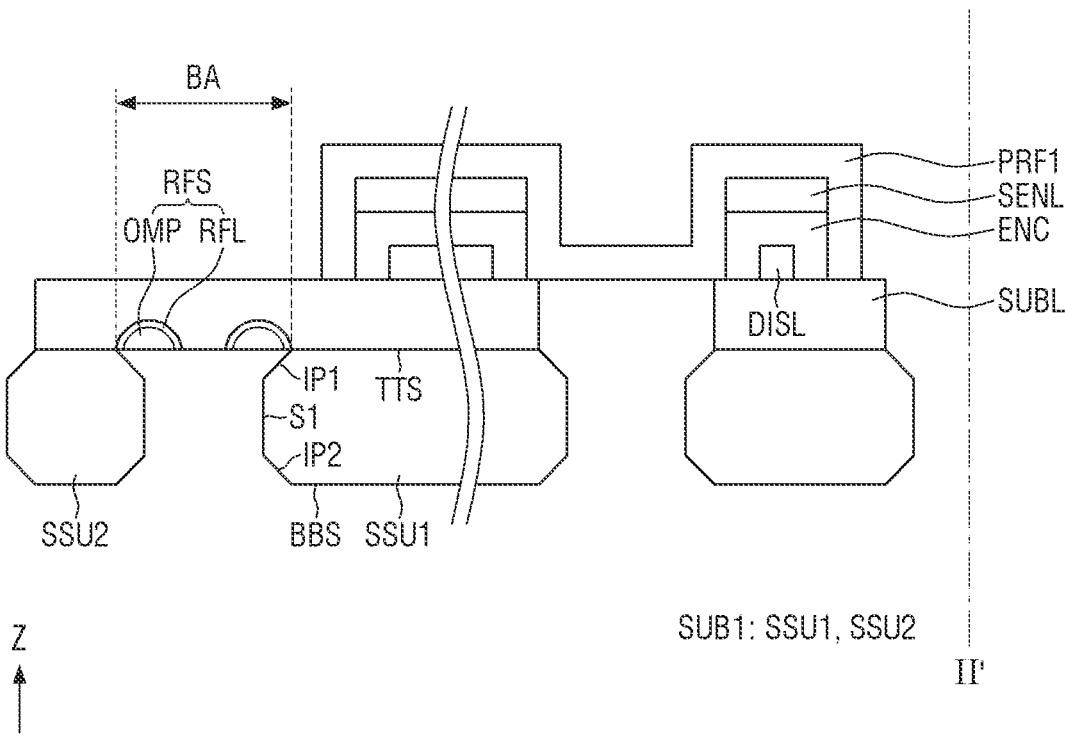

Accordingly, the plurality of display cells DPC are completely separated from the mother substrate MSUB. As shown in FIG. 29, the second protective film PRF2 may be detached after the etching process is completed. The plurality of display cells DPC are separated from the mother substrate MSUB to form the first substrate SUB1 including the first sub-substrate SSU1 and the second sub-substrate SSU2 spaced apart from each other, and the sub-material layer may be formed of the second substrate SUB2.

Figure 30:
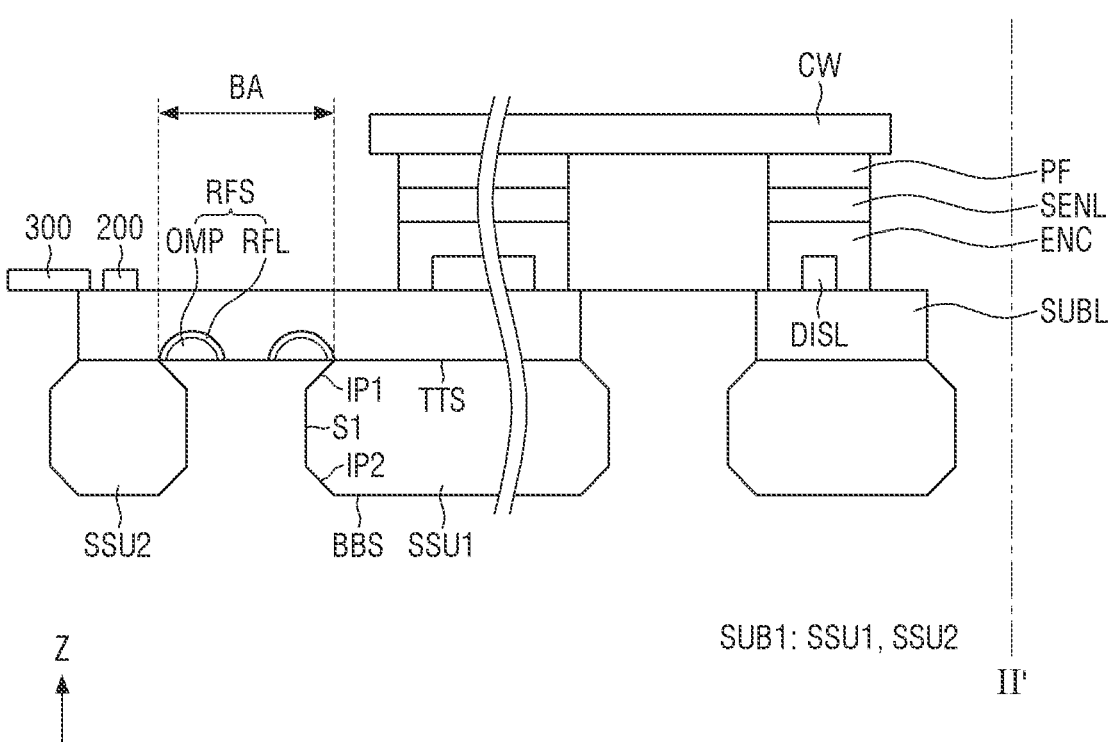

Next, as shown in FIG. 30, the driving IC 200 and the circuit board 300 are attached to each of the plurality of display cells DPC, and the first protective film PRF1 is detached from each of the plurality of display cells DPC. After that, the polarizing film PF and the cover window CW are attached (S160 of FIG. 15).

As described above, by using the etching process, the thickness of the mother substrate MSUB may be reduced, and the substrate SUB of each of the plurality of display cells DPC may be separated from the mother substrate MSUB. Therefore, the efficiency of the manufacturing process may be improved.

In addition, the reflective structure RFS may be formed to implement a multifocal laser LR so that the lateral side of the first substrate SUB1 has inclined surfaces. Accordingly, the impact resistance of the first substrate SUB1 may be improved. Also, because the reflective structure RFS blocks the laser from being irradiated to the signal lines thereon, it is possible to reduce or prevent the likelihood of the signal lines being damaged by the laser.

In the above-described method of manufacturing the display device of FIGS. 15 to 30, although it has been described that the reflective structure RFS is formed in the area where the mother substrate MSUB is removed, for example, the bending area BA, the edge area, and the through hole area, the present disclosure is not limited thereto. In one or more other embodiments, the reflective structure RFS may be formed only in an area on which metal lines or elements, such as signal lines are located or may be further formed in any one or more of the edge area and the through hole.

Figure 31:
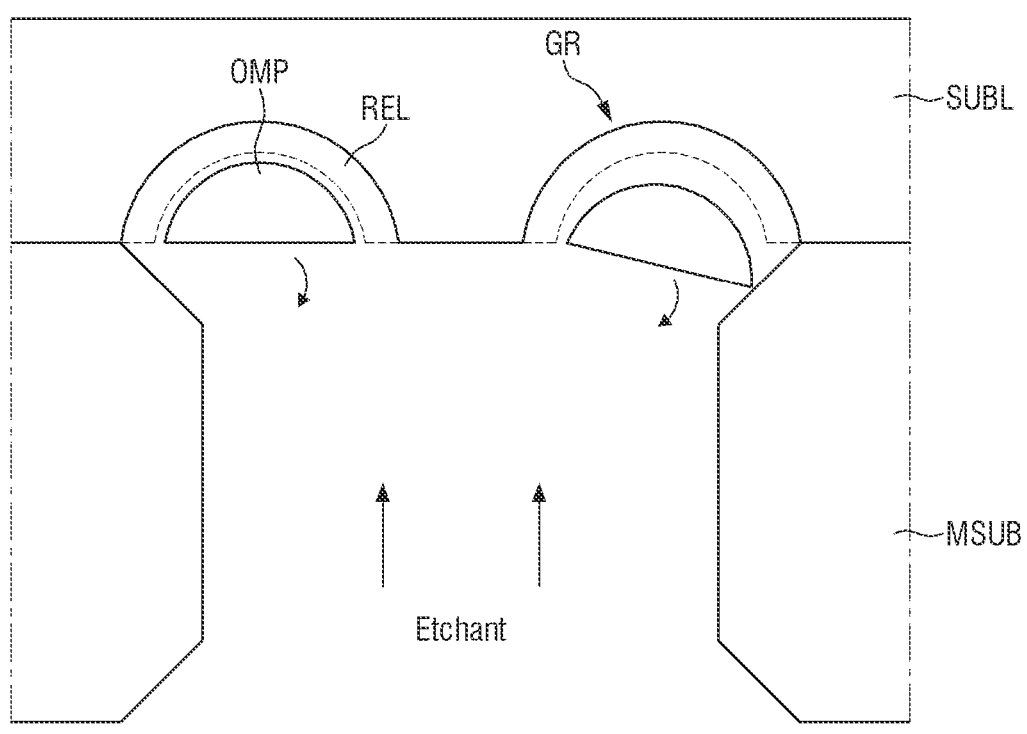
FIG. 31 is a diagram illustrating a method of manufacturing a display device according to one or more other embodiments.

FIG. 31 is a diagram illustrating a method of manufacturing a display device according to one or more other embodiments. FIG. 31 shows a state in which the reflective structure of the bending area of the display cell is removed.

Although the above-described FIG. 29 illustrates that the reflective structure RFS remains in the bending area BA of the display cell DPS, the reflective structure RFS may be concurrently or substantially simultaneously removed together with the mother substrate MSUB in the etching process of the mother substrate MSUB.

Referring to FIG. 31, when the etchant for etching the mother substrate MSUB is a hydrofluoric acid-based etchant, the etchant may also etch the reflective layer RFL of the reflective structure FRS. That is, when the reflective layer RFL is exposed to the etchant, the reflective layer RFL is etched and removed. As a result, the organic pattern OMP located under the reflective layer RFL is lifted off and detached. Accordingly, because the reflective structure RFS is concurrently or substantially simultaneously removed in the etching process of the mother substrate MSUB, the plurality of grooves GR may be formed in the sub-material layer SUBL.

Figure 32:
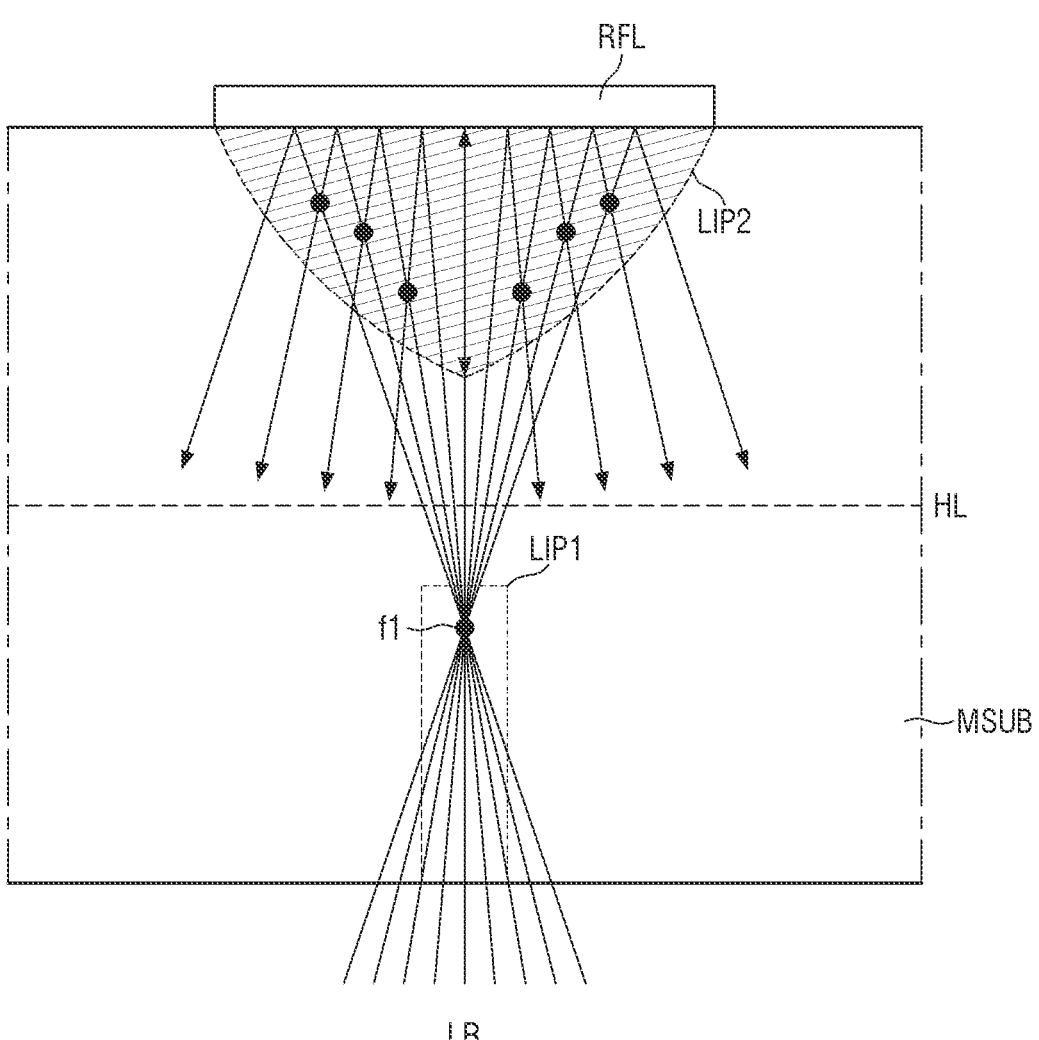
FIGS. 32 and 33 are diagrams illustrating a method of manufacturing a display device according to one or more other embodiments.
Figure 33:
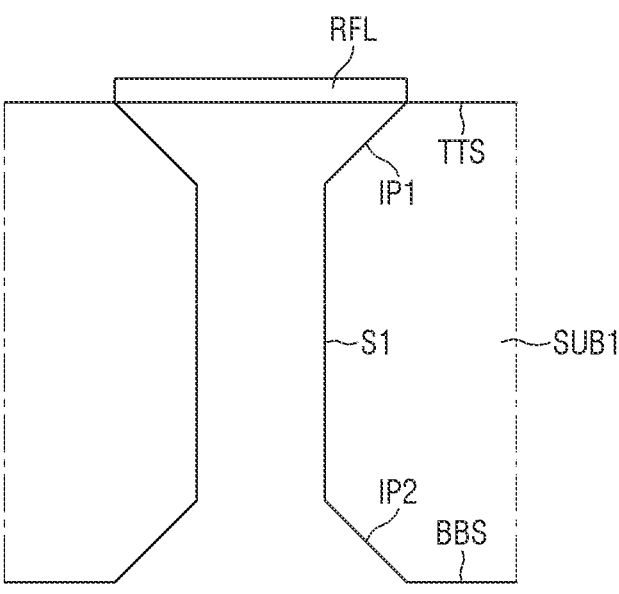

FIGS. 32 and 33 are diagrams illustrating a method of manufacturing a display device according to one or more other embodiments.

FIGS. 32 and 33 illustrate a method of manufacturing the display device including the reflective layers RFL1 and RFL2 of FIGS. 11 and 12, and show some differences among the above-described manufacturing methods of the display device. Hereinafter, descriptions overlapping those of the above-described embodiments of FIGS. 16 to 30 will be omitted and differences will be described.

Referring to FIG. 32, when the laser LR is irradiated onto the second surface of the mother substrate MSUB, the laser beams LR are irradiated to pass through the first focal point f1. The first focal point f1 may be located adjacent to the second surface of the mother substrate MSUB based on the horizontal line HL dividing the thickness in the third direction (the Z-axis direction) of the mother substrate MSUB. The laser LR may be irradiated such that the first focal point f1 moves toward the second surface of the mother substrate MSUB when the laser LR is irradiated.

The laser beams LR passing through the first focal point f1 may be reflected by the reflective layer RFL while passing through the mother substrate MSUB. Laser beams LR may be reflected by the reflective layer RFL acting as a flat plane mirror. In this case, in the area of the mother substrate MSUB adjacent to the reflective layer RFL, energy may be concentrated at a portion where the laser beam incident on the reflective layer RFL and the laser beam reflected from the reflective layer RFL intersect.

The laser LR irradiated to the mother substrate MSUB is irradiated while the first focal point f1 moves to the adjacent surface, thereby forming the first laser irradiation area LIP1 in the mother substrate MSUB. In addition, the second laser irradiation area LIP2 in which energy is concentrated by crossing the laser LR reflected by the reflective layer RFL, and the laser irradiated to the reflective layer RFL may be formed. Also, the reflective layer RFL may absorb some light of the laser LR.

As described above, when the laser LR is irradiated to the mother substrate MSUB, which is a glass substrate, the selectivity ratio of the glass by the etching solution may be changed. In addition, the reflective layer RFL partially absorbs the laser LR to radiate high heat from the reflective layer RFL, and the physical properties of the mother substrate MSUB may be changed by the high heat. That is, the selectivity ratio of the second laser irradiation area LIP2 adjacent to the reflective layer RFL by the etchant of the glass may be changed.

As shown in FIG. 33, when the etchant is sprayed on the second surface of the mother substrate MSUB, the etching rates of the first laser irradiation area LIP1 and the second laser irradiation area LIP2 of the mother substrate MSUB are faster than that of the area not irradiated with the laser LR. Accordingly, the first substrate SUB1 separated from the mother substrate MSUB may have a structure including the first inclined surface IP1 located between the side surface S1 and the upper surface TTS, and the second inclined surface IP2 located between the side surface S1 and the bottom surface BBS.

Accordingly, the lateral side of the first substrate SUB1 may be formed to have inclined surfaces by forming the reflective layer RFL to further form an area where the energy of the laser LR is concentrated. Accordingly, the impact resistance of the first substrate SUB1 may be improved. In addition, because the reflective layer RFL reduces or prevents the laser irradiated to the signal lines thereon, it is possible to keep the signal lines from being damaged by the laser.

In the manufacturing method of FIGS. 32 and 33, the laser LR has been described as an example of a dot line type, but the present disclosure is not limited thereto, and a filament, long spot, or Bessel beam type laser LR is also applicable.

Figure 34:
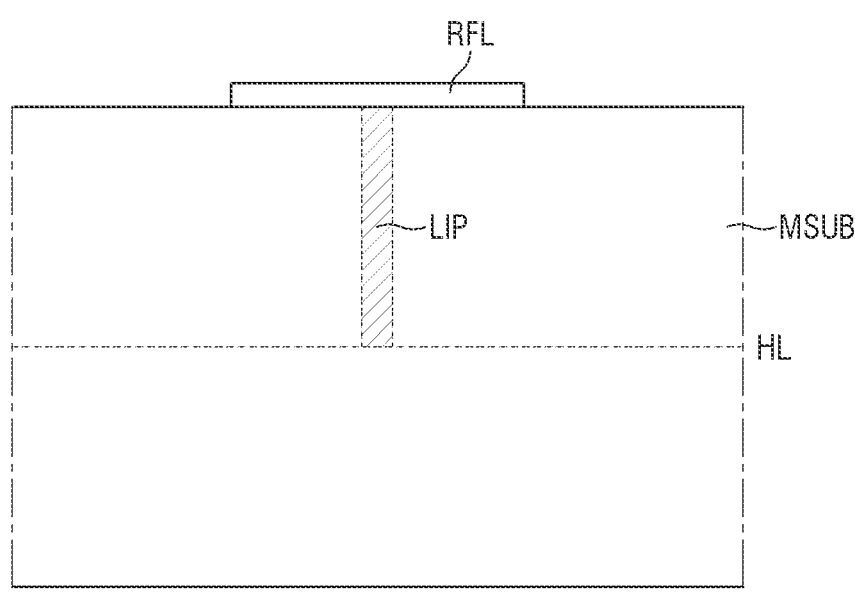
FIG. 34 is a diagram illustrating a method of manufacturing a display device according to one or more other embodiments.
Figure 35:
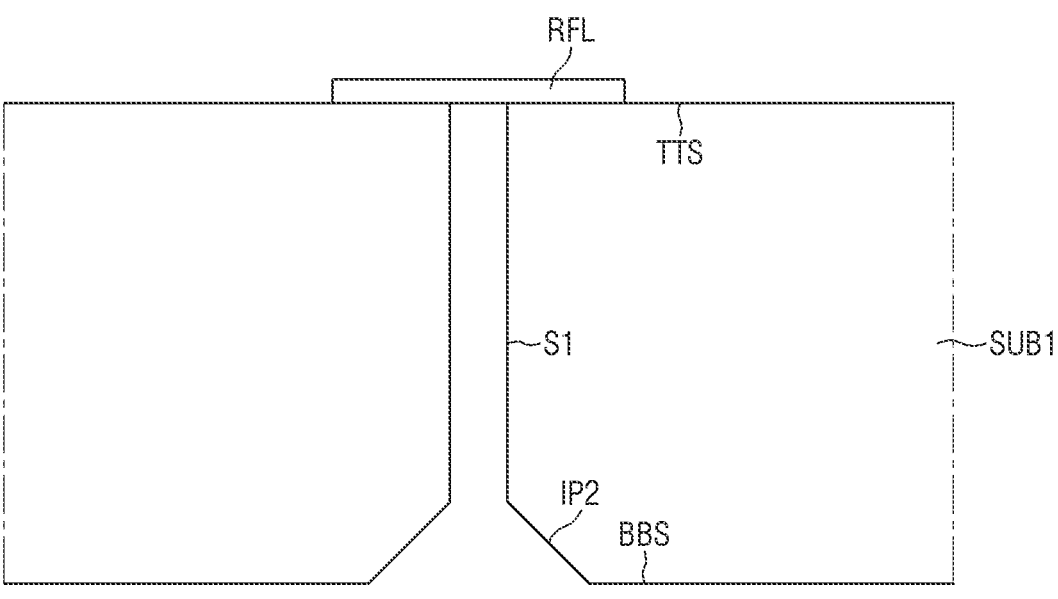
FIGS. 35 and 36 are diagrams illustrating structures of a portion of a display device according to one or more other embodiments.
Figure 36:
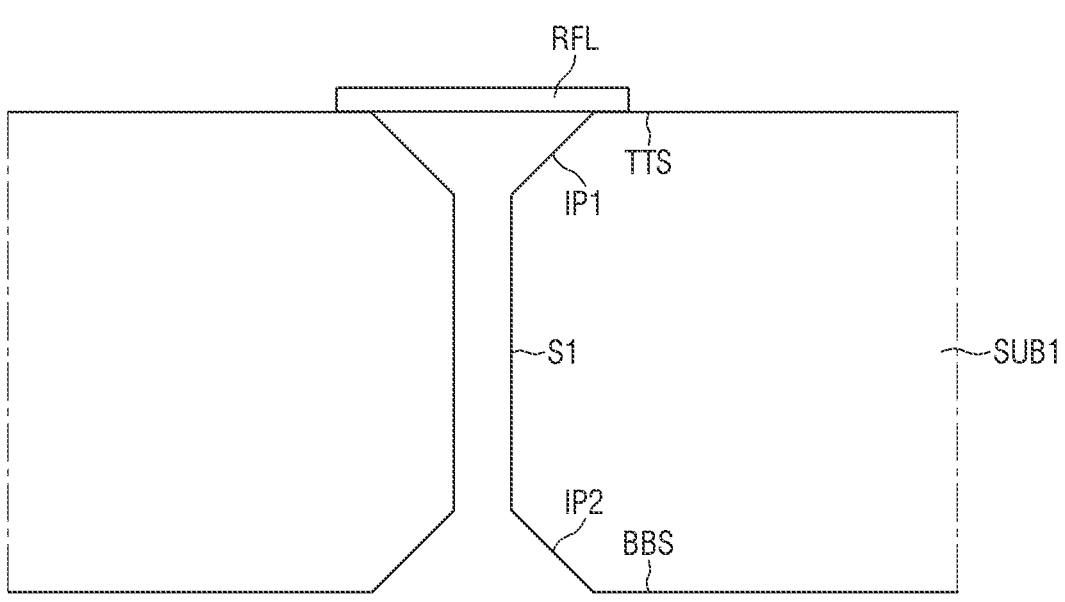

FIG. 34 is a diagram illustrating a method of manufacturing a display device according to one or more other embodiments. FIGS. 35 and 36 are diagrams illustrating structures of a portion of a display device according to one or more other embodiments.

FIG. 34 shows the mother substrate MSUB irradiated with the Bessel beam type laser, and FIGS. 35 and 36 show a portion of the display device manufactured by irradiating the Bessel beam type laser.

Referring to FIGS. 34 to 35, a laser may be irradiated onto the second surface of the mother substrate MSUB on which the reflective layer RFL is located. The laser may be the Bessel beam type laser. The laser may form a laser irradiation region LIP by distributing the laser energy in the area from the first surface of the mother substrate MSUB to the horizontal line HL bisecting the thickness of the mother substrate MSUB. In the presently described one or more embodiments, it has been described as an example that the laser irradiation area LIP is formed from the first surface of the mother substrate MSUB to a depth corresponding to about ½ of the thickness of the mother substrate MSUB, but is not limited thereto. As another example, the laser irradiation area LIP may be formed up to a depth corresponding to about ⅓ of the thickness of the mother substrate MSUB from the first surface of the mother substrate MSUB or a depth corresponding to about ⅔ of the thickness of the mother substrate MSUB.

The laser beam irradiated to the mother substrate MSUB may be re-irradiated to the laser irradiation area LIP as a portion of the laser beam is reflected by the reflective layer RFL as well as the mother substrate MSUB. Accordingly, the formation of the laser irradiation area LIP may be facilitated by increasing the laser energy of the laser irradiation area LIP.

When the laser is irradiated to the mother substrate MSUB, the selectivity ratio by the etchant of the mother substrate MSUB may change. For example, when the etchant is sprayed onto the second surface of the mother substrate MSUB, the etching rate of the laser irradiation area LIP of the mother substrate MSUB is faster than that of the non-laser irradiated area. That is, because the laser irradiation area LIP is etched with a slimming process in which the thickness of the mother substrate MSUB is reduced by the etchant, the first substrate SUB1 may have a tapered cross-section on the second surface of the first substrate SUB1 by isotropic etching as shown in FIG. 35. For example, the side surface S1 of the first substrate SUB1 may be formed to be perpendicular to the upper surface TTS, and may contact the bottom surface of the reflective layer RFL. Also, the second inclined surface IP2 may be formed between the side surface S1 and the bottom surface BBS of the first substrate SUB1. An angle between the side surface S1 of the first substrate SUB1 and the second inclined surface IP2, and between the second inclined surface IP2 and the bottom surface BBS of the first substrate SUB1 may be the obtuse angle.

In one or more other embodiments, as shown in FIG. 36, the first inclined surface IP1 may be further formed between the upper surface TTS and the side surface S1 of the first substrate SUB1. In this case, the angle between the upper surface TTS of the first substrate SUB1 and the first inclined surface IP1, and between the first inclined surface IP1 and the side surface S1 of the first substrate SUB1, may be the obtuse angle. Also, the first inclined surface IP1 of the first substrate SUB1 may contact the bottom surface of the reflective layer RFL.

Meanwhile, the arrangement relationship between the above-described first substrate SUB1 and the reflective layer RFL may be variously modified.

Figure 37:
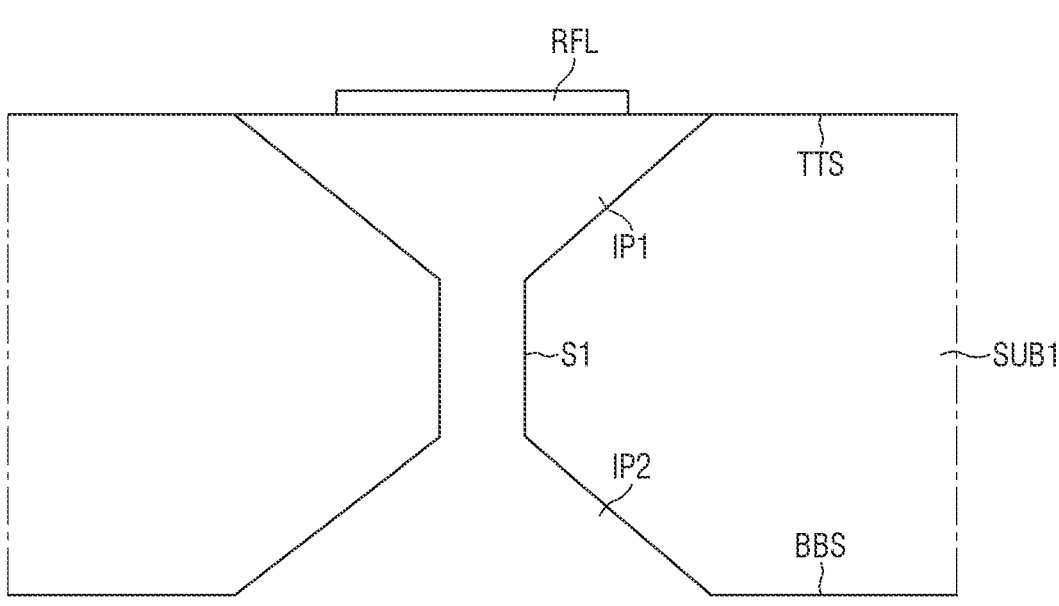
FIGS. 37 to 39 are diagrams illustrating various examples of display devices according to one or more other embodiments.
Figure 38:
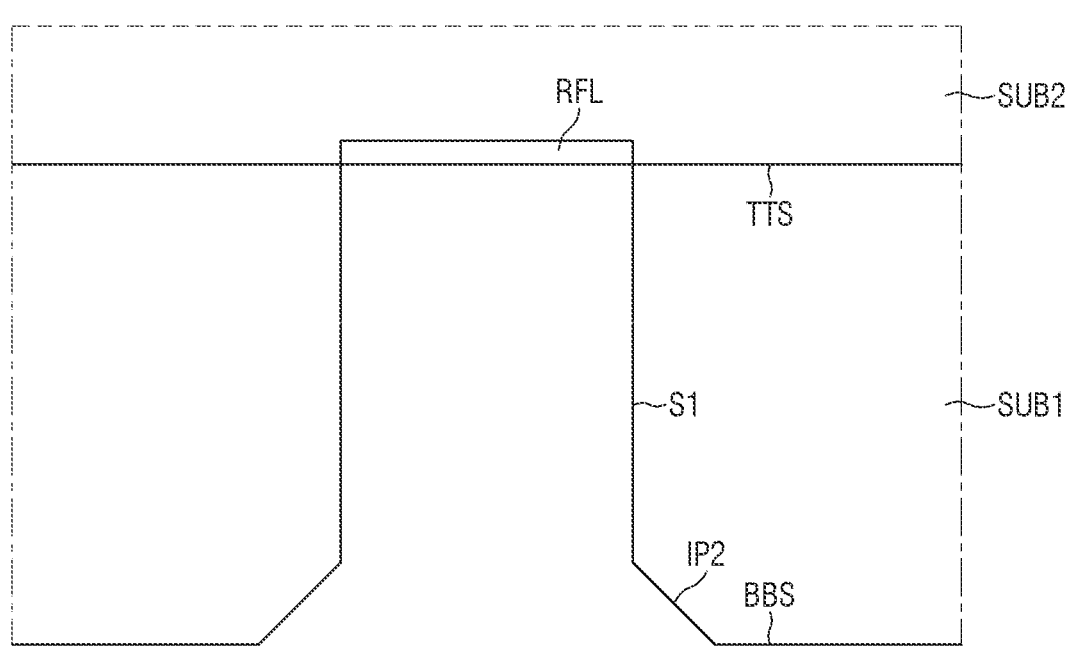
Figure 39:
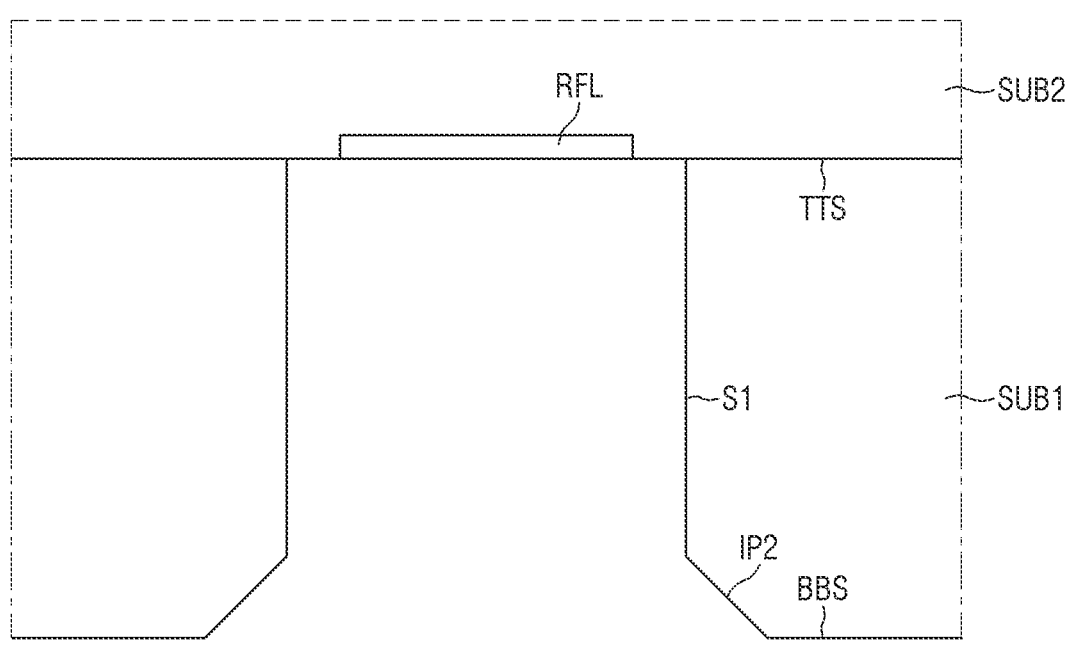

FIGS. 37 to 39 are diagrams illustrating various examples of display devices according to one or more other embodiments.

Referring to FIG. 37, the first inclined surface IP1 of the first substrate SUB1 may not contact the reflective layer RFL unlike FIG. 36 described above. In detail, the upper surface TTS of the first substrate SUB1 may be in contact with the bottom surface of the second substrate SUB2 while being spaced apart from the reflective layer RFL. The first inclined surface IP1 of the first substrate SUB1 may not contact the reflective layer RFL, and may contact the bottom surface of the second substrate SUB2. That is, the first substrate SUB1 may have a structure that does not contact the reflective layer RFL.

Referring to FIG. 38 which is another example, the side surface S1 of the first substrate SUB1 may be aligned with the side surface of the reflective layer RFL to coincide with each other unlike FIG. 35 described above. For example, the top surface TTS and the side surface S1 of the first substrate SUB1 may contact the side surface of the reflective layer RFL.

Referring to FIG. 39, which is another example, the side surface S1 of the first substrate SUB1 may not contact the reflective layer RFL unlike FIG. 38. For example, the upper surface TTS of the first substrate SUB1 may be in contact with the bottom surface of the second substrate SUB2 while being spaced apart from the reflective layer RFL. The side surface S1 of the first substrate SUB1 might not contact the reflective layer RFL, and instead may contact the bottom surface of the second substrate SUB2. That is, the first substrate SUB1 may have a structure that does not contact the reflective layer RFL. Also, the first substrate SUB1 might not overlap the reflective layer RFL in the thickness direction of the first substrate SUB1 (e.g., the reflective layer RFL may overlap the space between the first and second sub-substrates SSU1 and SSU2).

Meanwhile, the reflective layer RFL may remain in the display device 10 as in the embodiments of FIGS. 35 to 39 that disclose examples in which the reflective layer RFL is provided, but is not limited thereto. Also, it may be etched away at the same time. In this case, the area in which the reflective layer RFL is located may be formed as a groove as shown in FIG. 14.

In concluding the detailed description, those skilled in the art will appreciate that many variations and modifications can be made to the embodiments without substantially departing from the aspects of the present disclosure. Therefore, the disclosed embodiments are used in a generic and descriptive sense only and not for purposes of limitation.

What is claimed is:

1. A display device comprising:
a first substrate comprising a first sub-substrate and a second sub-substrate spaced apart from each other;
a second substrate above the first substrate, and defining a groove partially overlapping the first sub-substrate or the second sub-substrate at a first surface of the second substrate facing the first substrate, at least a portion of the groove not overlapping the first substrate; and
a display layer above the second substrate and configured to display an image.

2. The display device of claim 1, wherein the first sub-strate defines a separation part at which the first sub-substrate and the second sub-substrate are separated and spaced apart from each other, and
wherein the groove overlaps the separation part.

3. The display device of claim 2, wherein the separation part of the first substrate overlaps a bending area at which the second substrate is bent.

4. The display device of claim 1, wherein the groove is made of a plurality, the plurality of grooves comprising a first groove and a second groove spaced apart from each other.

5. The display device of claim 1, wherein the groove is defined by a curved surface having a concave shape toward a second surface of the second substrate that is opposite to the first surface of the second substrate.

6. A display device comprising:
a first substrate comprising a first sub-substrate and a second sub-substrate spaced apart from each other;
a second substrate above the first substrate, and defining a first groove partially overlapping the first sub-substrate and a second groove partially overlapping the second sub-substrate at a first surface of the second substrate facing the first substrate, at least a portion of the first groove and the second groove not overlapping the first substrate; and
a display layer above the second substrate and configured to display an image.

7. The display device of claim 6, wherein the first sub-substrate is in a display area overlapping the display layer, and the second sub-substrate is in a non-display area other than the display area.

8. An electronic device comprising:
a first substrate comprising a first sub-substrate and a second sub-substrate spaced apart from each other;
a second substrate above the first substrate, and defining a groove at a first surface of the second substrate facing the first substrate, at least a portion of the groove not overlapping the first substrate; and
a display layer above the second substrate and configured to display an image,
wherein the first sub-substrate and the second sub-substrate respectively comprise a first inclined surface between a side surface and an upper surface thereof, and a second inclined surface between the side surface and a bottom surface thereof.

* * * * *